(12) United States Patent
McCormack et al.

(10) Patent No.: US 9,490,874 B2
(45) Date of Patent: Nov. 8, 2016

(54) CONTACTLESS COMMUNICATION UNIT CONNECTOR ASSEMBLIES WITH SIGNAL DIRECTING STRUCTURES

(71) Applicant: Keyssa, Inc., Campbell, CA (US)

(72) Inventors: Gary D. McCormack, Tigard, OR (US); Emilio Sovero, Thousand Oaks, CA (US); Eric Sweetman, Portland, OR (US); Bojana Zivanovic, Portland, OR (US)

(73) Assignee: KEYSSA, INC., Campbell, CA (US)

(*) Notice: Subject to any disclaimer, the term of this patent is extended or adjusted under 35 U.S.C. 154(b) by 53 days.

(21) Appl. No.: 14/518,815

(22) Filed: Oct. 20, 2014

(65) Prior Publication Data

US 2015/0111496 A1 Apr. 23, 2015

Related U.S. Application Data

(60) Provisional application No. 61/893,061, filed on Oct. 18, 2013.

(51) Int. Cl.
*H04B 5/00* (2006.01)
*H01L 23/66* (2006.01)
*H01L 23/00* (2006.01)

(52) U.S. Cl.
CPC ............. *H04B 5/0031* (2013.01); *H01L 23/66* (2013.01); *H01L 24/13* (2013.01); *H01L 24/16* (2013.01); *H01L 24/32* (2013.01); *H01L 24/48* (2013.01); *H01L 2224/131* (2013.01); *H01L 2224/16245* (2013.01); *H01L 2224/32227* (2013.01); *H01L 2224/48227* (2013.01); *H01L 2224/48245* (2013.01); *H01L 2224/73265* (2013.01); *H01L 2924/00014* (2013.01); *H01L 2924/15311* (2013.01); *H01L 2924/181* (2013.01)

(58) Field of Classification Search
CPC ...... H04B 5/02; H04B 5/0031; H04B 1/123; H04B 5/00; H01L 23/66; H01L 24/13; H01L 24/16
USPC .......................... 455/41.1, 41.2, 25, 327, 333
See application file for complete search history.

(56) References Cited

U.S. PATENT DOCUMENTS

| | | | |
|---|---|---|---|
| 7,333,786 B2* | 2/2008 | Kikuchi | G06K 7/0008 340/10.1 |
| 7,865,214 B2* | 1/2011 | Kushima | G06K 7/10178 235/492 |
| 7,943,404 B2* | 5/2011 | Ding | H01Q 9/28 343/850 |
| 8,238,824 B2 | 8/2012 | Washiro | |
| 8,530,825 B1 | 9/2013 | Andle et al. | |
| 8,909,135 B2* | 12/2014 | McCormack | H04B 1/18 455/39 |
| 2005/0124307 A1* | 6/2005 | Ammar | H04B 1/38 455/183.2 |
| 2008/0002652 A1 | 1/2008 | Gupta et al. | |
| 2009/0218701 A1* | 9/2009 | Rofougaran | H01L 23/645 257/778 |
| 2010/0117891 A1* | 5/2010 | Utagawa | G01S 7/03 342/175 |
| 2010/0231452 A1* | 9/2010 | Babakhani | G01S 7/032 342/368 |

(Continued)

*Primary Examiner* — Marceau Milord
(74) *Attorney, Agent, or Firm* — Van Court & Aldridge LLP

(57) ABSTRACT

Contactless extremely high frequency (EHF) signal directing and blocking structures are disclosed herein. The EHF signal directing structures may focus EHF signal energy along a desired EHF signal pathway. The EHF signal blocking structures may minimize signal propagation through substrates such as circuit boards. Focusing EHF signal energy and selectively blocking the EHF signal energy can minimize or eliminate crosstalk and enhance data transmission speed and integrity.

45 Claims, 21 Drawing Sheets

(56) References Cited

U.S. PATENT DOCUMENTS

| | | | | |
|---|---|---|---|---|
| 2010/0283700 A1* | 11/2010 | Rajanish | ............... | H01L 23/66 343/793 |
| 2011/0181484 A1* | 7/2011 | Pettus | ............... | H01L 23/66 343/833 |
| 2012/0028582 A1* | 2/2012 | Tandy | ............... | H01L 23/48 455/41.2 |
| 2012/0263244 A1 | 10/2012 | Kyles et al. | | |
| 2012/0290760 A1* | 11/2012 | McCormack | ............... | H04B 5/0037 710/303 |
| 2012/0307932 A1 | 12/2012 | McCormack et al. | | |
| 2013/0257670 A1 | 10/2013 | Sovero et al. | | |
| 2013/0271331 A1 | 10/2013 | Redd | | |
| 2014/0266331 A1* | 9/2014 | Arora | ............... | H03B 19/14 327/119 |

\* cited by examiner

CONTACTLESS COMMUNICATION UNIT CONNECTOR ASSEMBLIES WITH SIGNAL DIRECTING STRUCTURES

RELATED APPLICATION

This application claims the benefit of U.S. Provisional Patent Application No. 61/893,061 filed Oct. 18, 2013, the disclosure of which is incorporated by reference in its entirety for all purposes.

FIELD OF THE INVENTION

The present disclosure relates to contactless connector assemblies and more specifically to contactless connector assemblies that control a signaling pathway of extremely high frequency signals.

BACKGROUND

Advances in semiconductor manufacturing and circuit design technologies have enabled the development and production of integrated circuits (ICs) with increasingly higher operational frequencies. As a result, electronic products and systems incorporating such integrated circuits are able to provide much greater functionality than previous generations of products. This additional functionality has generally included the processing of increasingly larger amounts of data at increasingly higher speeds.

BRIEF SUMMARY

Contactless extremely high frequency (EHF) signal directing and blocking structures are disclosed herein. The EHF signal directing structures may focus EHF signal energy along a desired EHF signal pathway. The EHF signal blocking structures may minimize signal propagation through substrates such as circuit boards. Focusing EHF signal energy and selectively blocking the EHF signal energy can minimize or eliminate crosstalk and enhance data transmission speed and integrity.

BRIEF DESCRIPTION OF THE DRAWINGS

Figure 1:
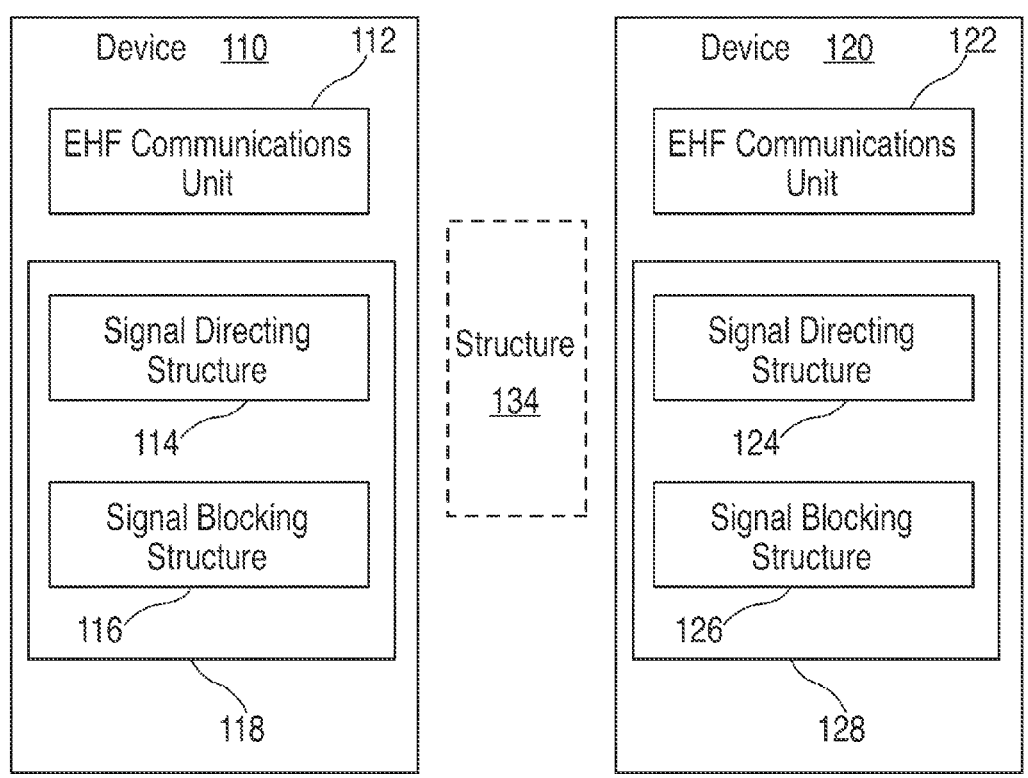
Figure 2:
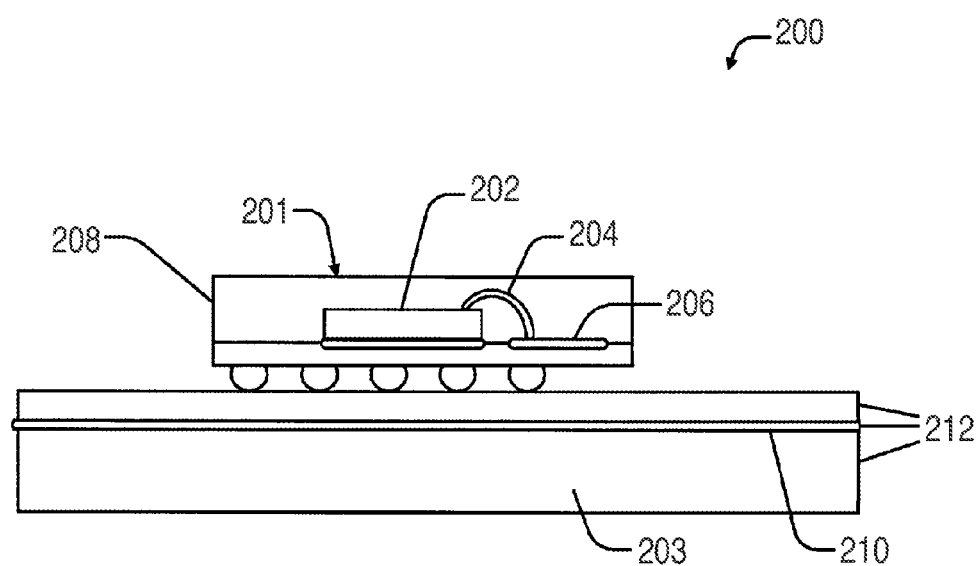
Figure 3:
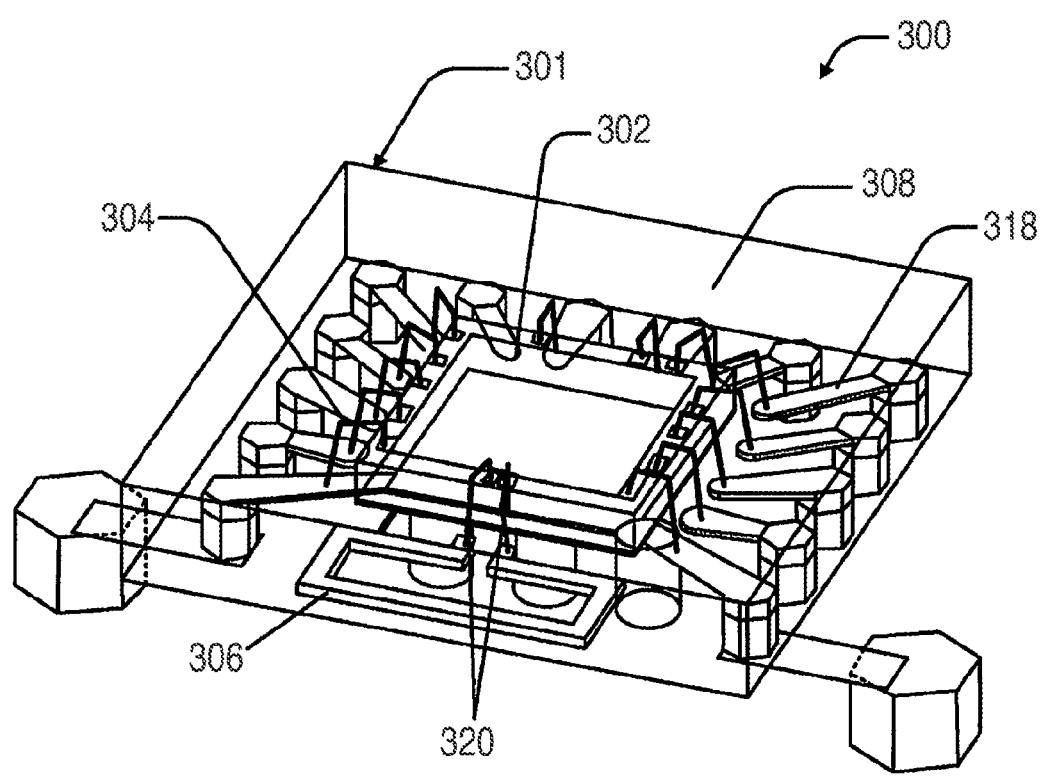
Figure 4:
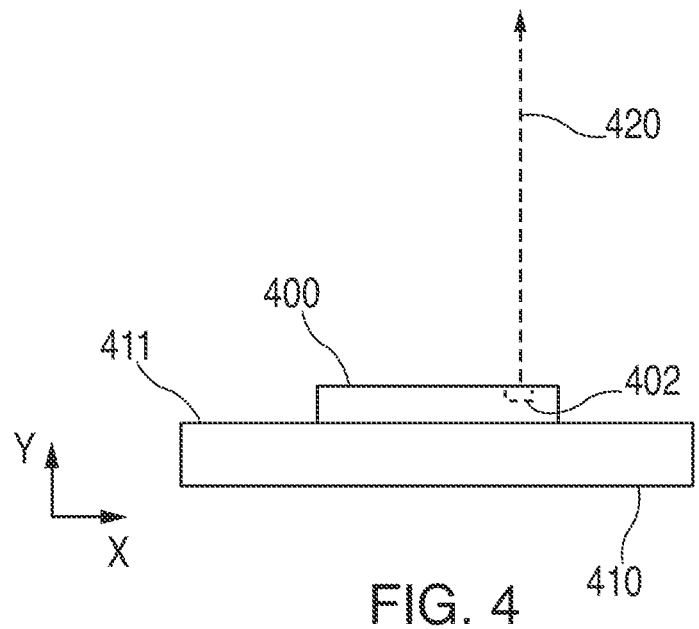
Figure 5:
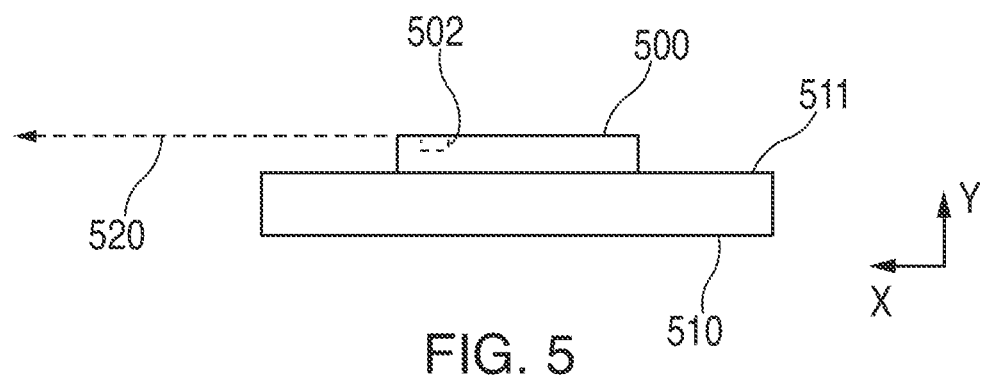
Figure 6A:
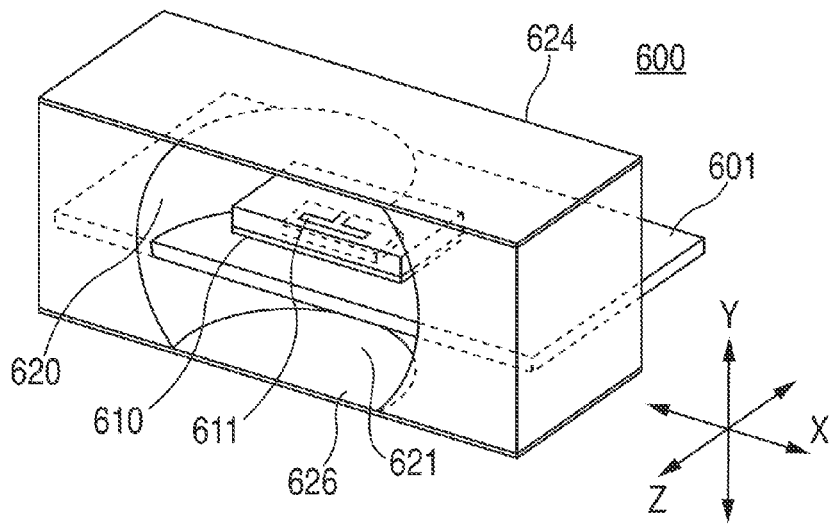
Figure 6B:
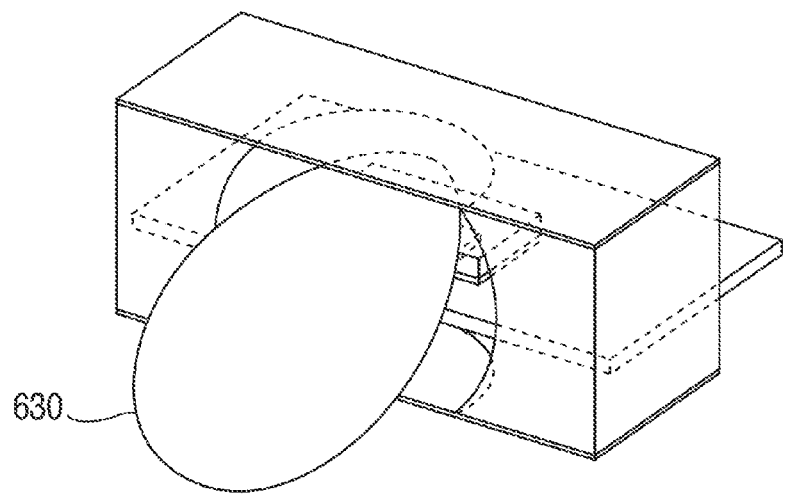
Figure 9:
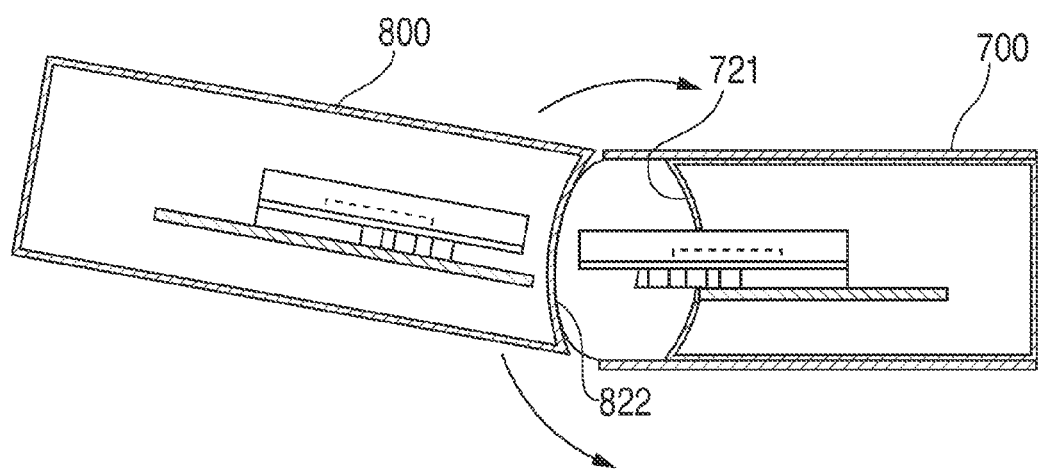
Figure 10A:
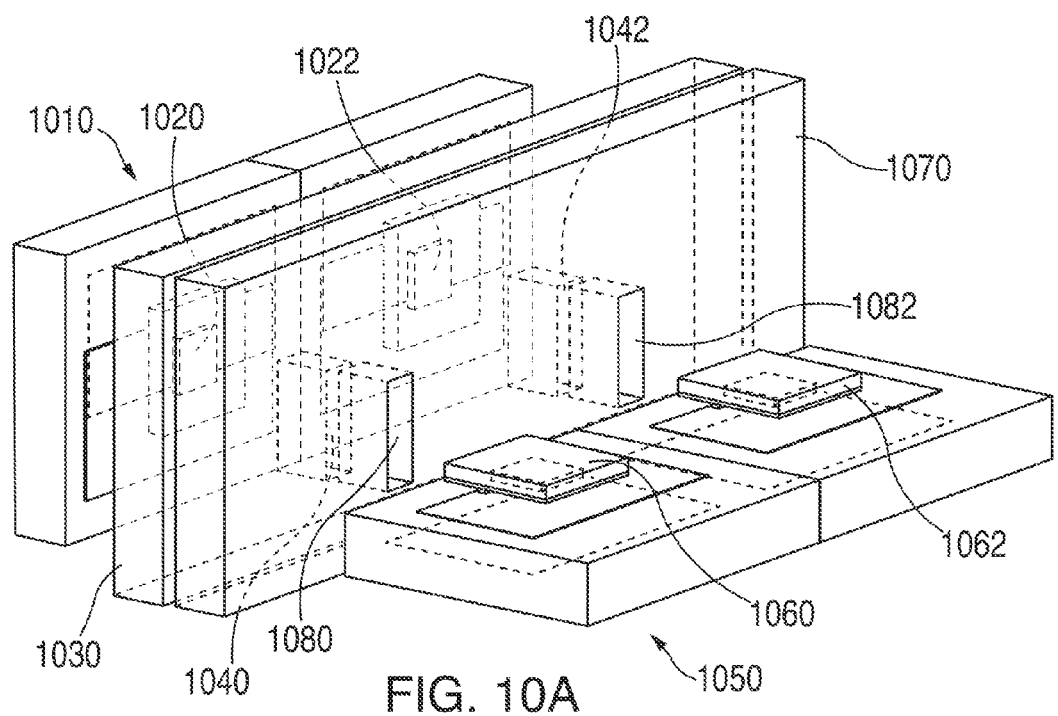
Figure 10B:
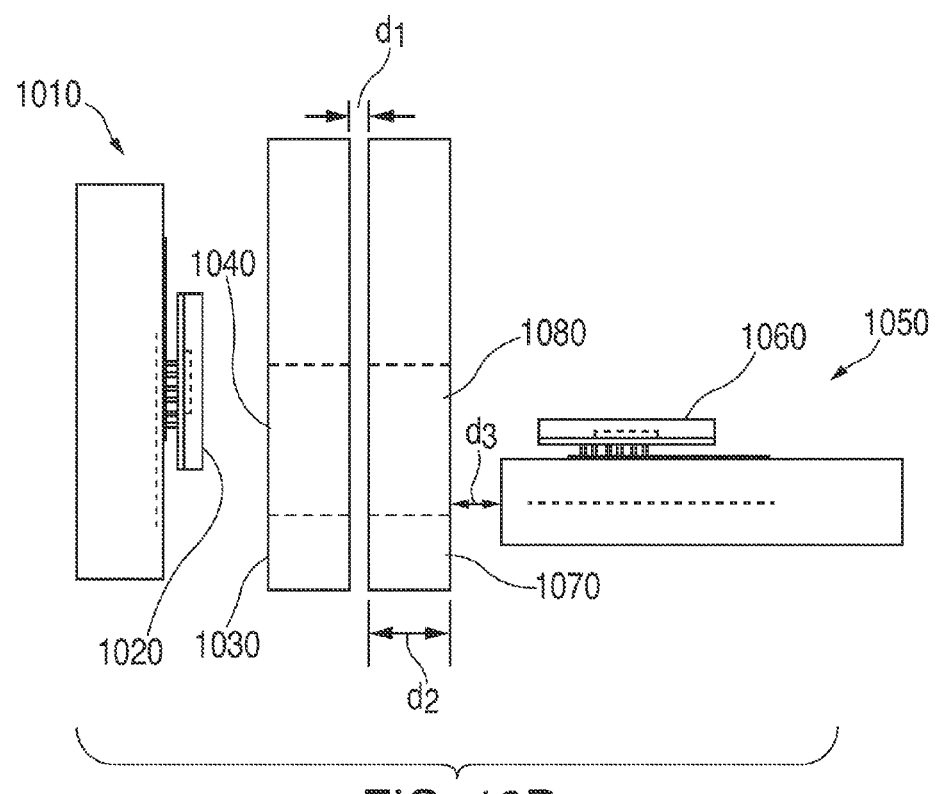
Figure 10C:
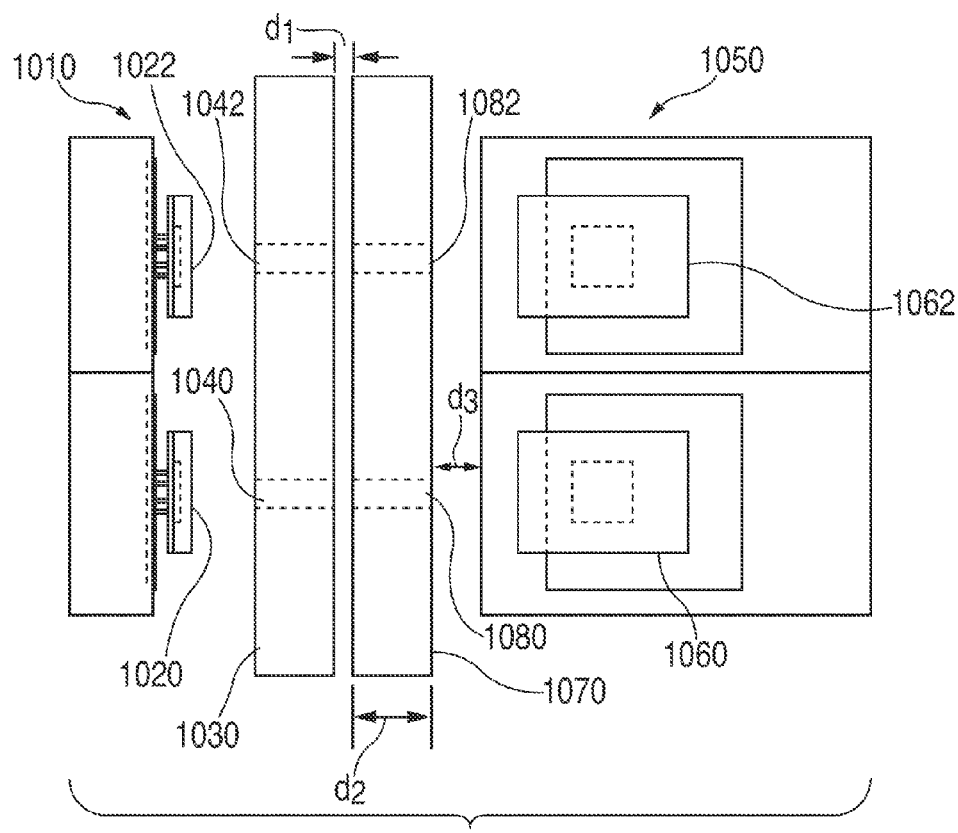
Figure 11:
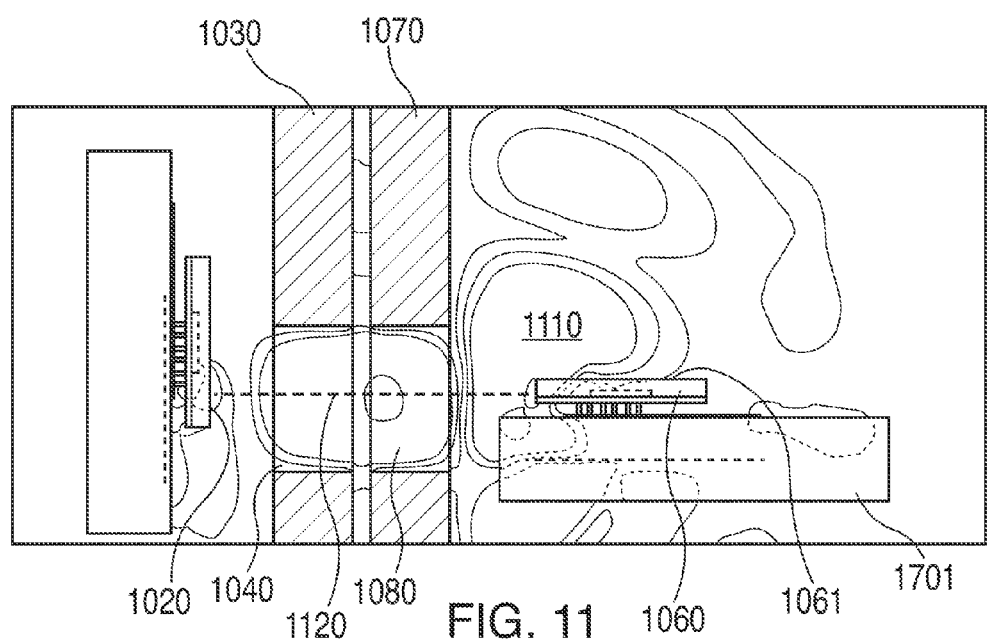
Figure 12A:
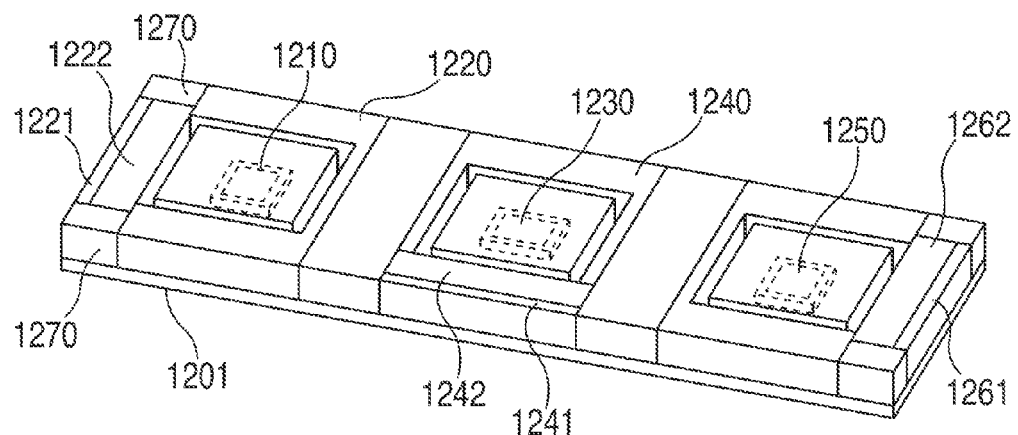
Figure 12B:
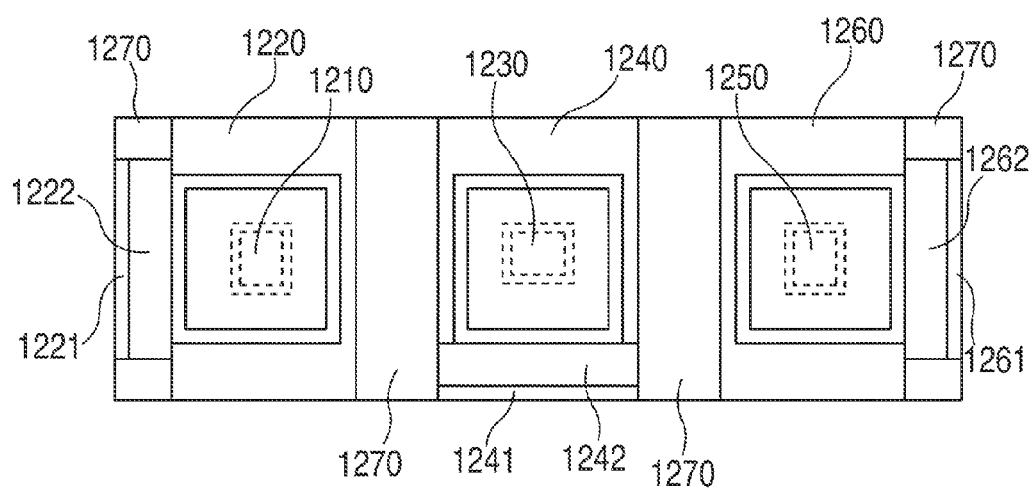
Figure 12C:
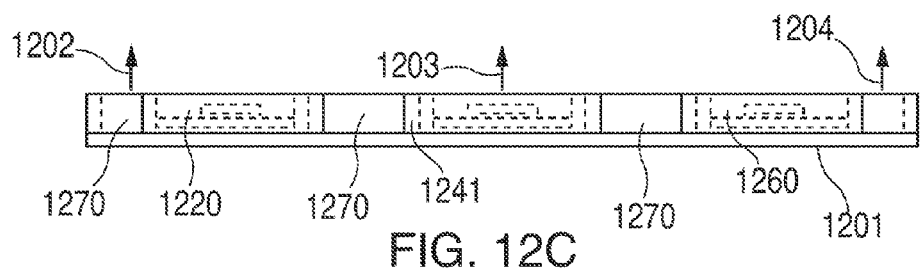
Figure 13:
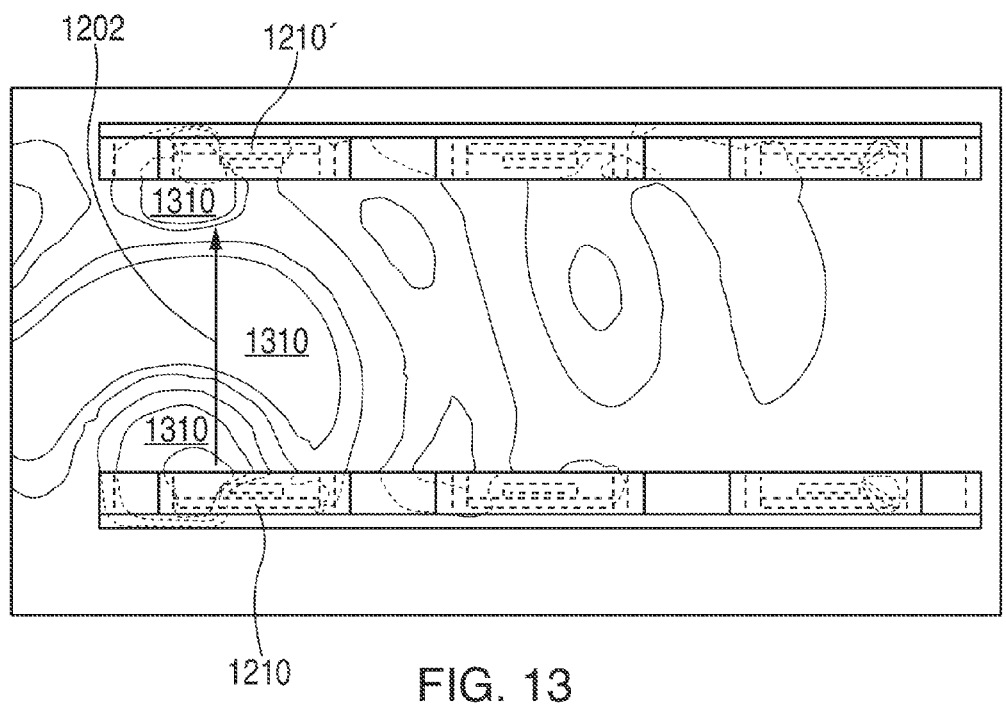
Figure 14A:
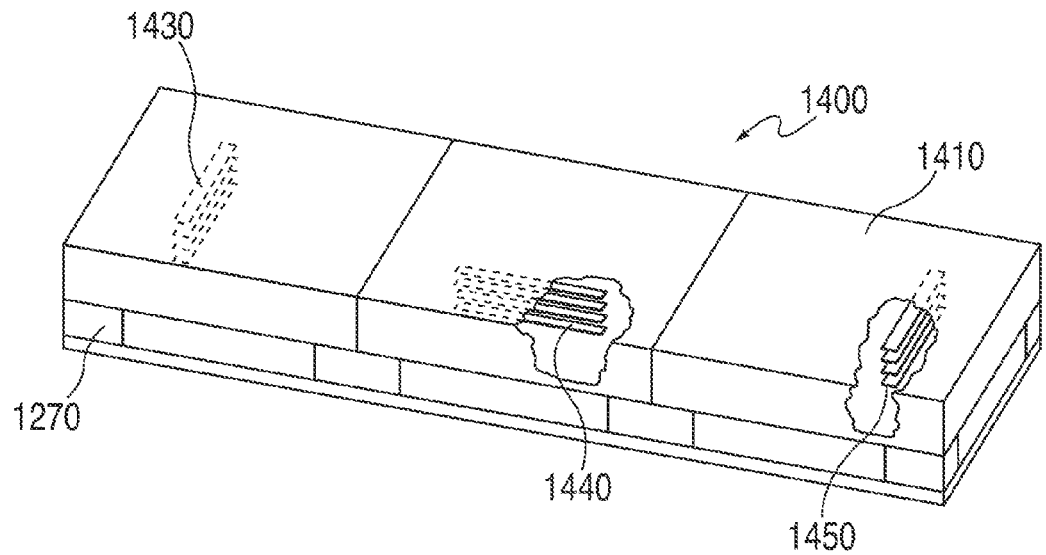
Figure 14B:
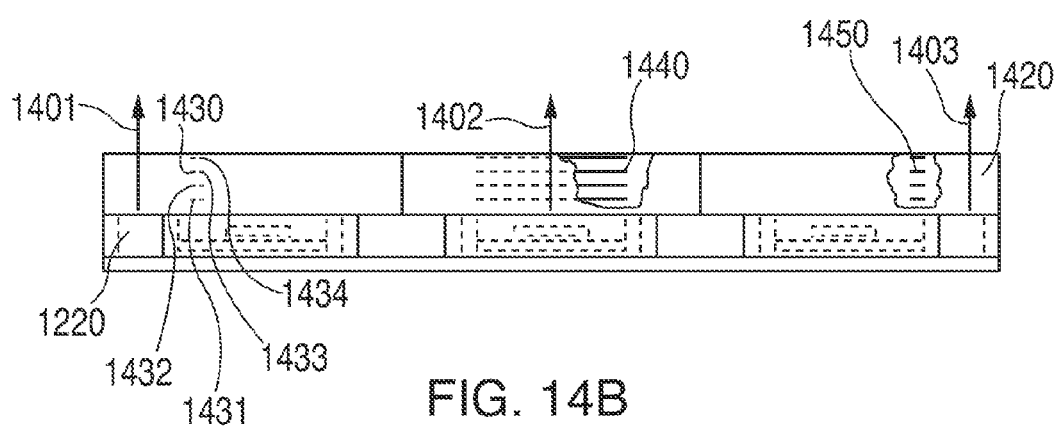
Figure 15A:
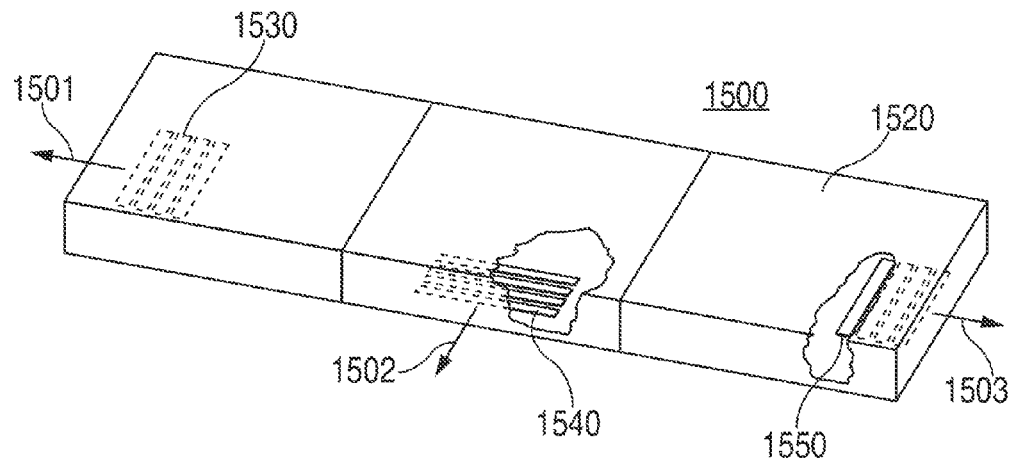
Figure 15B:
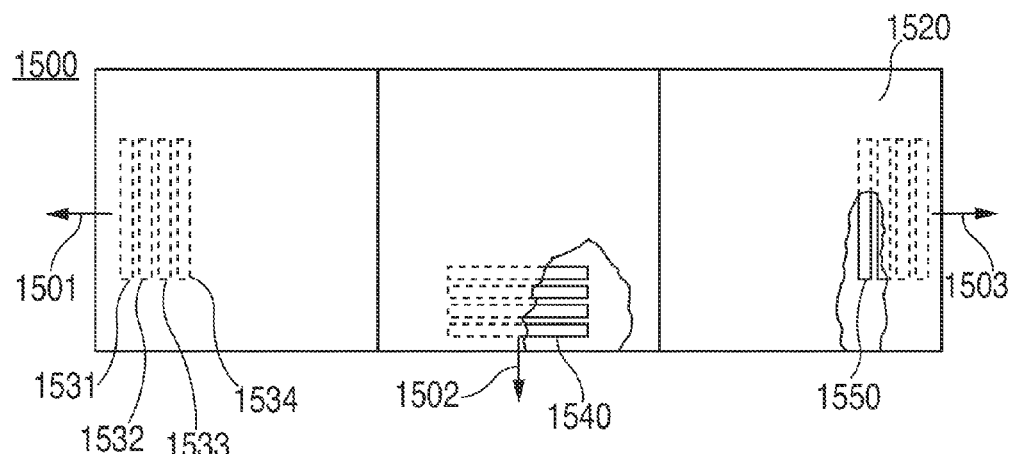
Figure 15C:
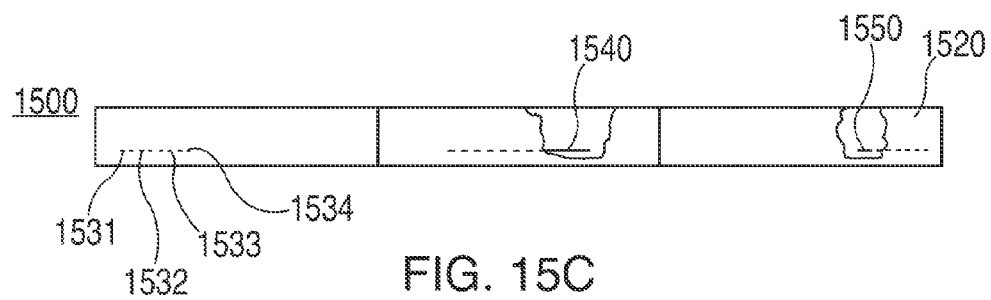
Figure 16A:
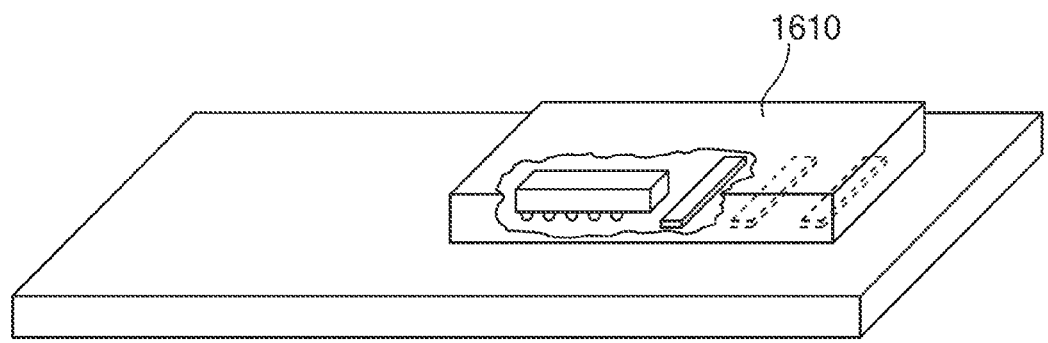
Figure 16B:
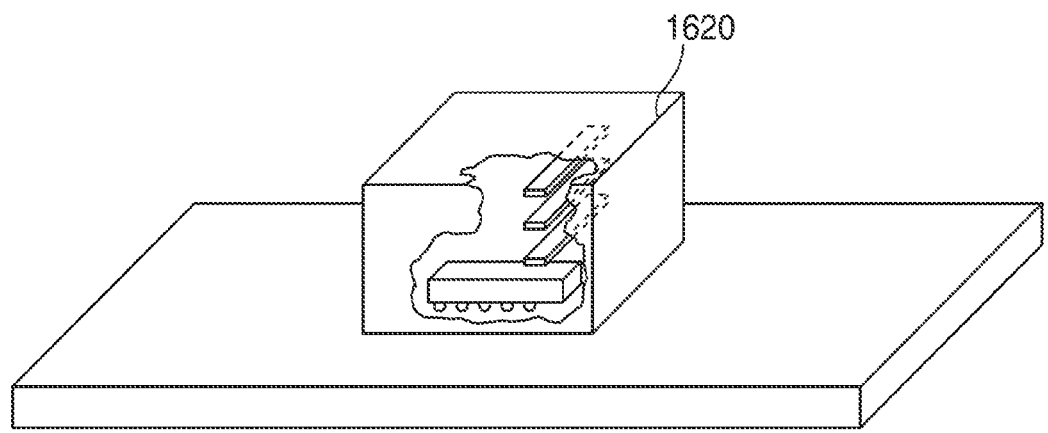
Figure 17A:
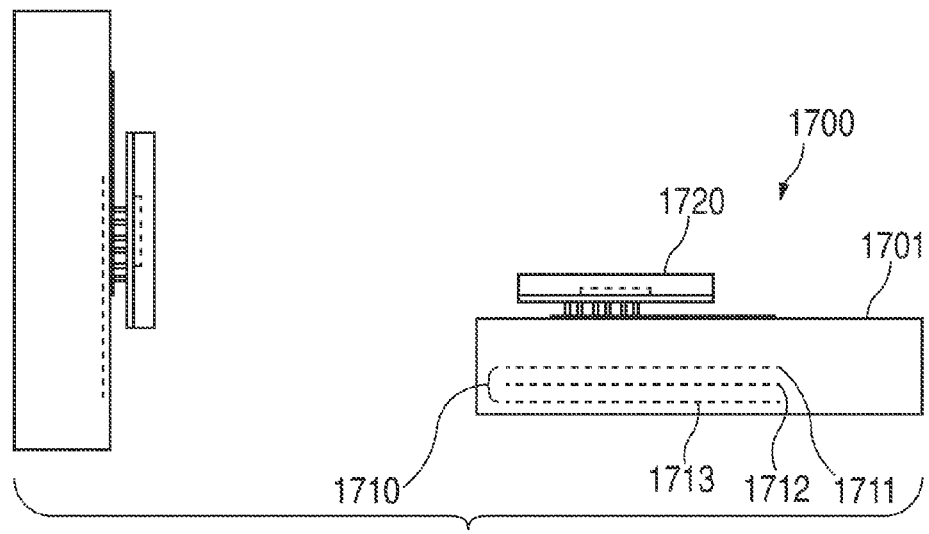
Figure 17B:
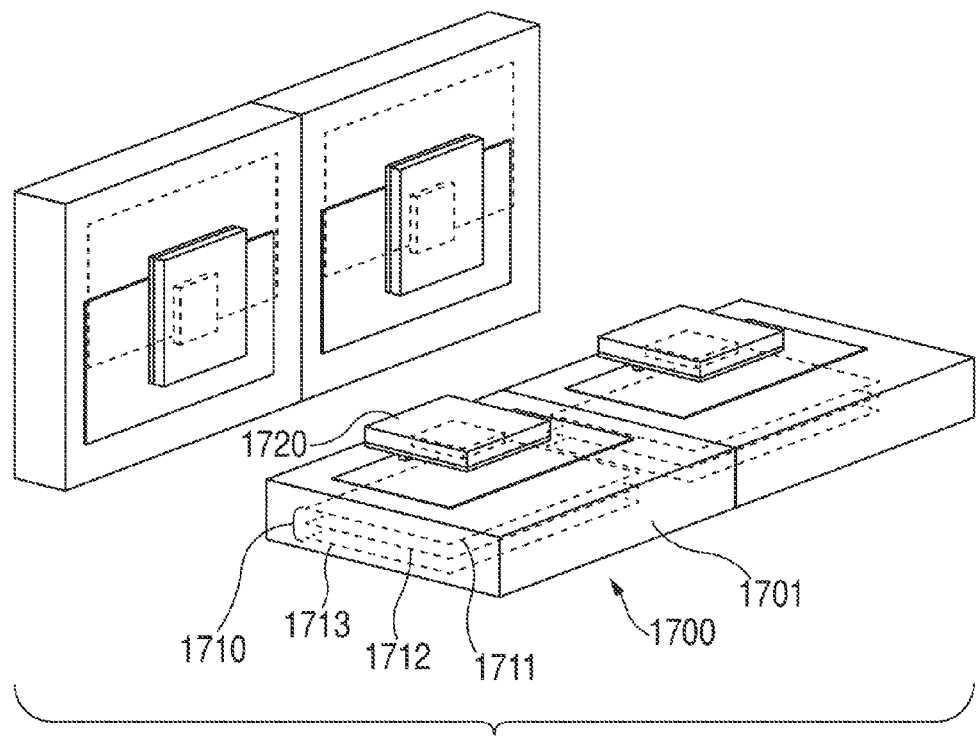
Figure 18A:
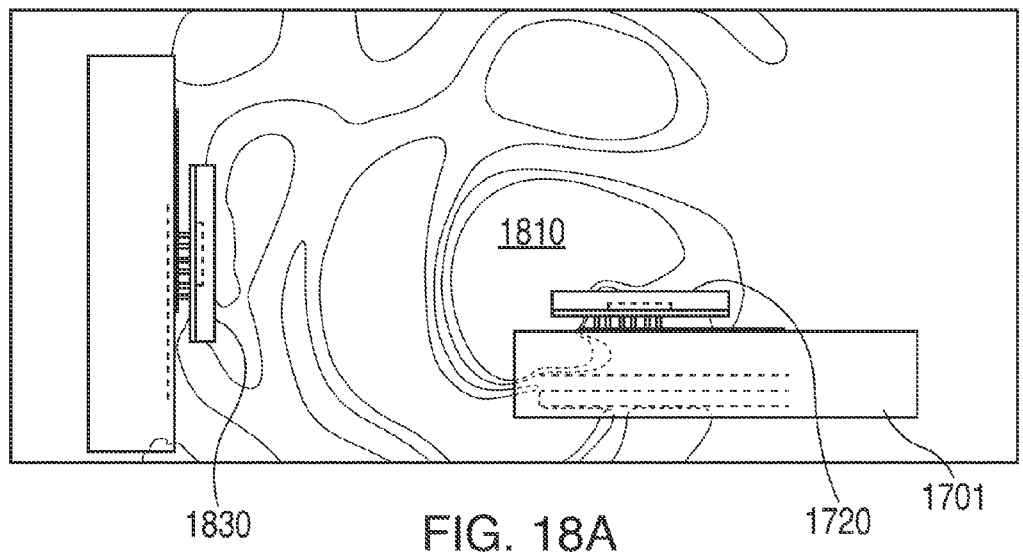
Figure 18B:
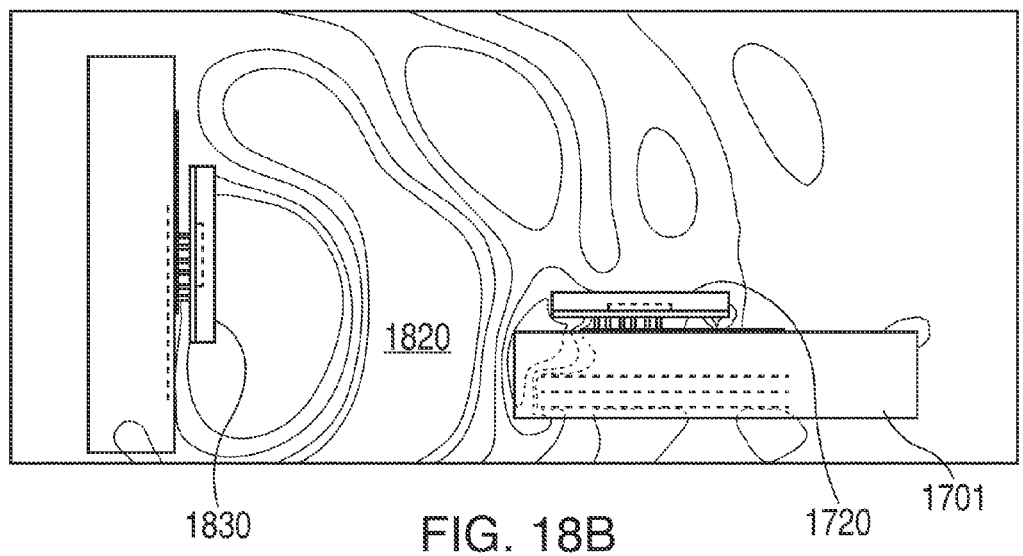
Figure 19A:
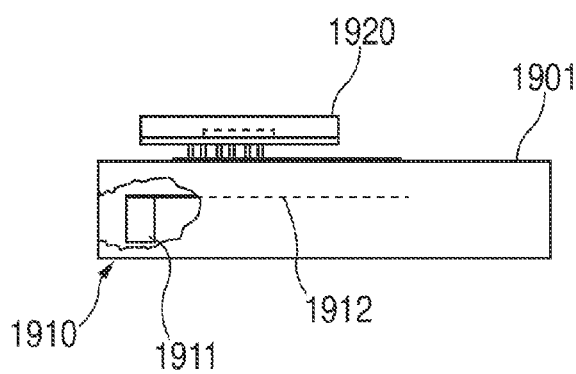
Figure 19B:
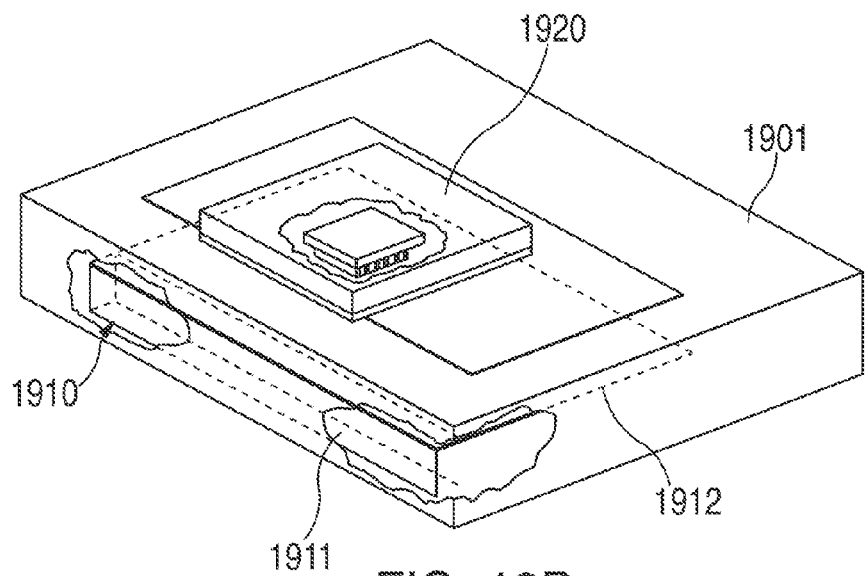
Figure 20:
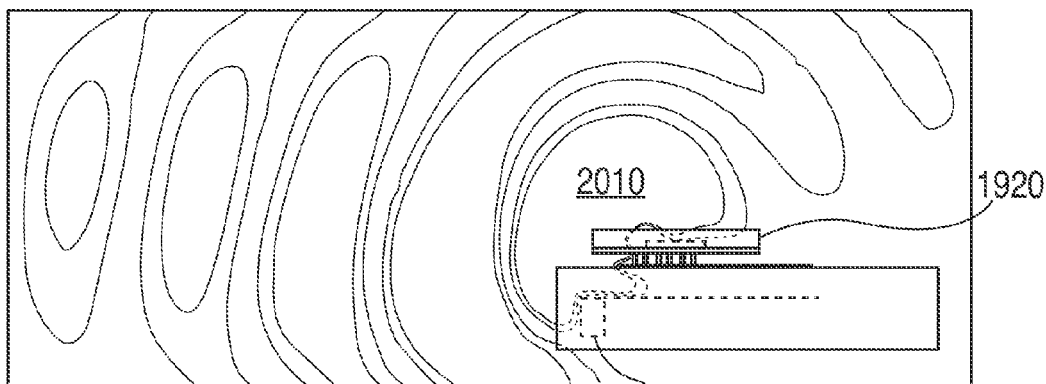
Figure 21:
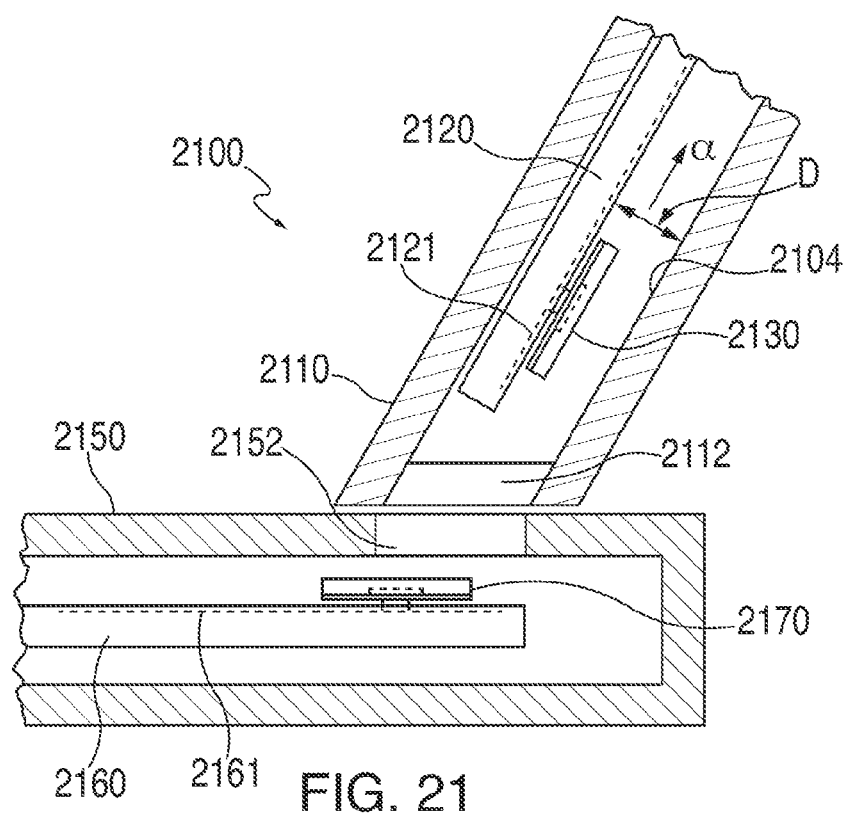
Figure 22:
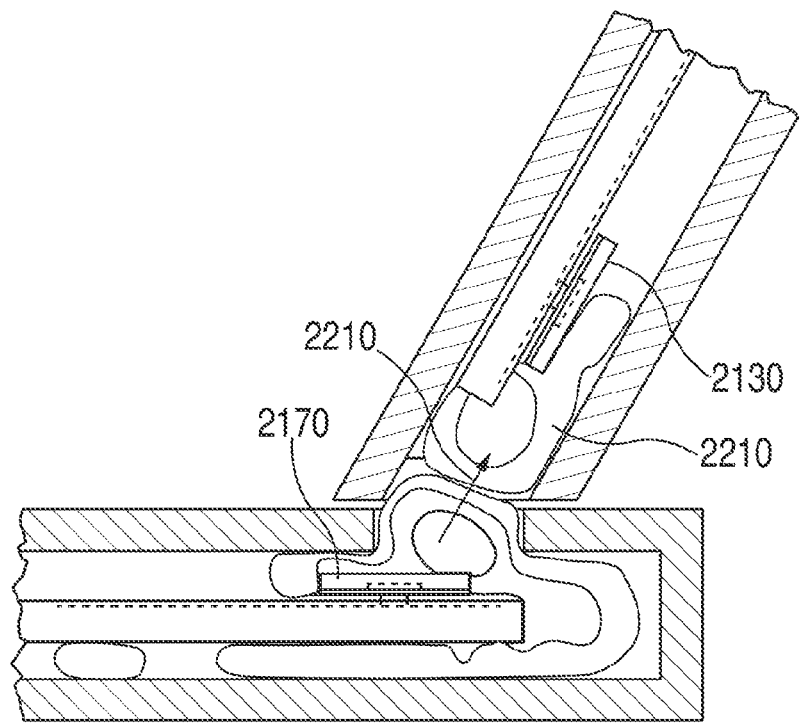

Having thus described communication between devices in general terms, reference is now made to the accompanying drawings, which are not necessarily drawn to scale, and wherein:

FIG. 1 illustrates an embodiment of a communication system;

FIG. 2 is a side view of a first example of an EHF communication unit useable in the system of FIG. 1;

FIG. 3 is an isometric view of a second example of an EHF communication unit;

FIG. 4 shows an illustrative EHF CCU mounted to a substrate, according to an embodiment;

FIG. 5 shows another illustrative EHF CCU mounted to a substrate, according to an embodiment;

FIG. 6A shows a perspective view of a spherical signal shaping assembly, according to an embodiment;

FIG. 6B shows a perspective view of an illustrative shaped beam formed by the spherical signal shaping assembly of FIG. 6A, according to an embodiment;

FIGS. 7A-7D show different views of a beam shaping assembly according to various embodiments;

FIGS. 8A-8D show different views of another beam shaping assembly that may interface with the beam shaping assembly of FIGS. 7A-7D, according to various embodiments;

FIG. 9 shows the assemblies of FIGS. 7A-7D and 8A-8D interfacing with each other via their respective mating portions, according to an embodiment;

FIGS. 10A-10C show different views of a two device system that contactlessly communicates using EHF CCUs, according to an embodiment;

FIG. 11 shows an illustrative EHF signal propagation diagram radiating in the system of FIGS. 10A-10C, according to an embodiment;

FIGS. 12A-12C show different views of mezzanine beam forming structures according to an embodiment;

FIG. 13 shows an illustrative screen shot of EHF signals being transmitted from the mezzanine beaming forming structure of FIGS. 12A-12C, according to an embodiment;

FIGS. 14A and 14B show illustrative perspective and front views, respectively, of an assembly, according to an embodiment;

FIGS. 15A-15C show illustrative perspective, top, and front views, respectively, of superstrate beam directing structure, according to an embodiment;

FIGS. 16A and 16B show different superstrate structures according to various embodiments;

FIGS. 17A and 17B show an illustrative side and perspective views of an assembly having a signal blocking structure incorporated within a substrate, according to an embodiment;

FIGS. 18A and 18B show illustrative screen shot of EHF signal radiation, according to various embodiments;

FIGS. 19A and 19B show an illustrative side and perspective views of an assembly having a signal blocking structure incorporated within a substrate, according to an embodiment;

FIG. 20 shows an illustrative screen shot of EHF signal radiation, according to an embodiment;

FIG. 21 shows an assembly that uses its housing as part of its beam directing structure, according to an embodiment; and FIG. 22 shows an illustrative screen shot of EHF signal radiation, according to an embodiment.

DETAILED DESCRIPTION

Illustrative embodiments are now described more fully hereinafter with reference to the accompanying drawings, in which representative examples are shown. The disclosed communication system and method may be embodied in many different forms and should not be construed as limited to the embodiments set forth herein. Like numbers refer to like elements throughout.

In the following detailed description, for purposes of explanation, numerous specific details are set forth to provide a thorough understanding of the various embodiments. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

In today's society and ubiquitous computing environment, high-bandwidth modular and portable electronic devices are being used increasingly. Security and stability of communication between and within these devices is important to their operation. In order to provide improved secure high-bandwidth communications, the unique capabilities of contactless communication between electronic devices and between sub-circuits within each device may be utilized in innovative and useful arrangements.

Such communication may occur between radio frequency communication units, and communication at very close distances may be achieved using EHF frequencies (typically, 30-300 GHz) in an EHF communication unit. An example of an EHF communications unit is an EHF comm-link chip. Throughout this disclosure, the terms comm-link chip, and comm-link chip package are used to refer to ERE antennas embedded in IC chips or packages. Examples of such comm-link chips can be found, for example, in U.S. Patent Application Publication Nos. 2012/0263244 and 2012/0307932. Comm-link chips are an example of a communication device, also referred to as communication unit, whether or not they provide wireless communication and whether or not they operate in the EHF frequency band.

The acronym "EHF" stands for Extremely High Frequency, and refers to a portion of the electromagnetic (EM) spectrum in the range of 30 GHz to 300 GHz (gigahertz). The term "transceiver" may refer to a device such as an IC (integrated circuit) including a transmitter (Tx) and a receiver (Rx) so that the integrated circuit may be used to both transmit and receive information (data). Generally, a transceiver may be operable in a half-duplex mode (alternating between transmitting and receiving), a full-duplex mode (transmitting and receiving simultaneously), or configured as either a transmitter or a receiver. A transceiver may include separate integrated circuits for transmit and receive functions. The terms "contactless," "coupled pair," and "close proximity coupling" as used herein, refer to electromagnetic (EM) rather than electrical (wired, contact-based) connections and transport of signals between entities (such as devices). As used herein, the term "contactless" may refer to a carrier-assisted, dielectric coupling system. The connection may be validated by proximity of one device to a second device. Multiple contactless transmitters and receivers may occupy a small space. A contactless link established with electromagnetics (EM) may be channelized in contrast with a wireless link which typically broadcasts to several points.

FIG. 1 illustrates a communication system 100. As shown, system 100 may include a first device 110 configured to couple to a second device 120. First device 110 may be configured to communicate with and/or connect to second device 120 and vice versa. Further, first device 110 and second device 120 can be electronic devices capable of connecting and communicating with each other. First device 110 may couple directly to device 120 via a direct coupling or via a physical coupling member (e.g., cable) that can couple the two devices together. For example, device 110 can be a device such as a mobile device or a computer, and device 120 can be a cable device designed to interface with the device 110. First device 110 may include one or more ERE contactless communication units (CCUs) 112, signal directing structure 114, and signal blocking structure 116. Similarly, second device 120 may include one or more EHF contactless communication units (CCUs) 122, signal directing structure 124, and signal blocking structure 126. Signal directing structure 114 and signal blocking structure 116 may be collectively referred to herein as beam directing structures 118. Signal directing structure 124 and signal blocking structure 126 may be collectively referred to herein as beam directing structures 128. Various beam directing structures discussed herein can include one or both of the signal directing and signal blocking structures. Beam directing structures 118 and 128 may operate to focus EHF signals along one or more desired signal pathways that exist between devices 110 and 120. In some embodiments, beam directing structures 118 and 128 may operate in conjunction with structure 134 to focus EHF signals along one or more desired signal pathways. Structure 134 may include one or both of the signal directing and signal blocking structures.

EHF CCUs 112 and 122 can be an EHF transceiver capable of selectively transmitting and receiving EHF signals. When operating as a transmitter, the EHF CCUs may transmit an electromagnetic EHF signal, and when operating as a receiver, the EHF CCUs may receive an electromagnetic EHF signal. For example, in one embodiment, device 110 can include two EHF CCUs and device 120 can include two EHF CCUs. In device 110, a first EHF CCU may operate as a transmitter and a second EHF CCU may operate as a receiver. Similarly, device 120 may include first and second EHF CCUs that operate as transmitter and receiver, respectively. The transmitter EHF CCU of device 110 may transmit EHF signals to the receiver EHF CCU of device 120, and the transmitter EHF CCU of device 120 may transmit EHF signals to the receiver EHF CCU of device 110.

Beam directing structures 118 and 128 may be used to selectively block EHF signals from radiating to various locations within the device. Each EHF CCU may exhibit a radiation field when transmitting and/or receiving an EHF signal. The dimensions of a radiation field associated with a first EHF CCU can potentially overlap the radiation field of one or more other EHF CCUs. Such overlap can cause cross-talk or interference with EHF signaling. Beam directing structures 118 and 128 may be constructed to simultaneously direct EHF signals along desired pathways and block and contain the EHF signals from traversing or entering undesired regions. Beam directing structures 118 and 128 can direct or focus EHF signal energy into a cross sectional area smaller than the transverse dimensions of the EHF CCU's radiation field. As a result, the EHF signals can be focused to travel along a desired signal path and away from undesirable paths. Beam directing structures 118 and 128 may constructed to exhibit any suitable shape. For example, the structures may include an encapsulant that partially or fully covers an EHF CCU. As another example, the structures may be characterized as a signal collimating structure (e.g., a chimney) that surrounds an EHF CCU, but has an open channel for an EHF signal pathway.

Beam directing structures can be constructed from a combination of different materials to shape the direction of signal propagation and to mitigate EHF leakage (which may cause cross-talk). These materials can include transmissive materials that are operable to facilitate propagation of EHF signals, reflective materials that are operable to reflect EHF signals, and absorptive materials that are operable to absorb EHF signals. Examples of transmissive materials can include plastics and other materials that are electrically non-conductive (i.e., dielectric). Reflective materials can include, for example, metals, metal alloys, and other materials that are electrically conductive. Examples of absorptive materials can include, for example, magnetically loaded, rubber materials that are electrically non-conductive, but exhibit effective EHF dampening resonance due to their high permittivity and permeability.

In some embodiments, the beam directing structures can be constructed from just one of the different material types. For example, the signal directing structure can be constructed from just the transmissive material or just the reflective material. In other embodiments, the structure can be constructed from two or more of the different material types. For example, the signal directing structure can be constructed from transmissive and reflective materials, from transmissive and absorptive materials, or from reflective and absorptive materials. As yet another example, structures 118 and 128 can be constructed from transmissive, reflective, and absorptive materials.

FIG. 2 is a side view of an exemplary EHF communication circuit 200 showing a simplified view of some structural components. As illustrated, the communication circuit may include an integrated circuit package 201 that includes a die 202 mounted on a connector printed circuit board (PCB) 203, a lead frame (not shown), one or more conductive connectors such as bond wires 204, a transducer such as antenna 206, and an encapsulating material 208.

Die 202 may include any suitable structure configured as a miniaturized circuit on a suitable die substrate, and is functionally equivalent to a component also referred to as a "chip" or an "integrated circuit (IC)." The die substrate may be formed using any suitable semiconductor material, such as, but not limited to, silicon. Die 202 may be mounted in electrical communication with the lead frame. The lead frame (similar to lead frame 318 of FIG. 3) may be any suitable arrangement of electrically conductive leads configured to allow one or more other circuits to operatively connect with die 202. The leads of the lead frame may be embedded or fixed in a lead frame substrate. The lead frame substrate may be formed using any suitable insulating material configured to substantially hold the leads in a predetermined arrangement.

Further, the electrical communication between die 202 and leads of the lead frame may be accomplished by any suitable method using conductive connectors such as, one or more bond wires 204. Bond wires 204 may be used to electrically connect points on a circuit of die 202 with corresponding leads on the lead frame. In another embodiment, die 202 may be inverted and use conductive connectors including bumps, or die solder balls rather than bond wires 204, which may be configured in what is commonly known as a "flip chip" arrangement. Antenna or transducer element 206 may be any suitable structure configured as a transducer or antenna to convert between electrical and electromagnetic signals. Element 206 may be configured to operate in an EHF spectrum, and may be configured to transmit and/or receive electromagnetic signals, in other words as a transmitter, a receiver, or a transceiver. In an embodiment, element 206 may be constructed as a part of the lead frame. IC package 201 may include more than one element 206. In another embodiment, element 206 may be separate from, but operatively connected to die 202 by any suitable method, and may be located adjacent to die 202. For example, element 206 may be connected to die 202 using antenna bond wires (similar to 320 of FIG. 3). Alternatively, in a flip chip configuration, the element 206 may be connected to die 202 without the use of the bond wires (see element 320). In other embodiments, element 206 may be disposed on die 202 or on PCB 203.

Encapsulating material 208 may hold the various components of IC package 201 in fixed relative positions. Encapsulating material 208 may be any suitable material configured to provide electrical insulation and physical protection for the electrical and electronic components of the IC package. For example, encapsulating material 208 may be a mold compound, glass, plastic, ceramic, or any combination thereof. Encapsulating material 208 may be formed in any suitable shape. For example, encapsulating material 208 may be in the form of a rectangular block, encapsulating all components of the IC package except the unconnected leads of the lead frame. One or more external connections may be formed with other circuits or components. For example, external connections may include ball pads and/or external solder balls for connection to a printed circuit board. Encapsulating material 208, along with other components of IC package 201, may have a dielectric value, referred to herein as $D_{CCU}$. This dielectric value may be a consideration taken into account by various interface embodiments herein to achieve optimal signal direction orientation.

IC package 201 may be mounted on a connector PCB 203. Connector PCB 203 may include one or more laminated layers 212, one of which may be a PCB ground plane 210. PCB ground plane 210 may be any suitable structure configured to provide an electrical ground to circuits and components on the IC package. With the placement of the ground layer, at an appropriate distance from the antenna, the electromagnetic radiation pattern may be directed outwards from the substrate.

FIG. 3 is a simplified isometric view of another example of an EHF contactless communication circuit 300 showing some structural components. As illustrated, communication circuit 300 may include an IC package 301 that may in turn include a die 302, a lead frame 318, one or more conductive connectors such as bond wires 304, a transducer such as element 306, one or more antenna bond wires 320, and an encapsulating material 308. Die 302, lead frame 318, one or more bond wires 304, element 306, element bond wires 320, and an encapsulating material may be functionally similar to components such as die 202, bond wires 204, element 206, and encapsulating material 208 of IC package 201, respectively, as described in FIG. 2. Further, communication circuit 300 may include a connector PCB similar to PCB 203 (not shown).

In FIG. 3, die 302 is encapsulated in encapsulating material 308, along with the bond wires 304 and 320. In this embodiment, the IC package may be mounted on the connector PCB. The connector PCB may include one or more laminated layers, one of which may be a PCB ground plane. The PCB ground plane may be any suitable structure configured to provide an electrical ground to circuits and components on the PCB. With the placement of the ground layer, at an appropriate distance from the antenna, the electromagnetic radiation pattern may be directed outwards from the substrate. Encapsulating material 308, along with other components of IC package 301, may have a dielectric value, $D_{CCU}$. This dielectric value may be a consideration taken into account by various interface embodiments herein to achieve optimal signal direction orientation.

FIG. 4 shows a grossly simplified and illustrative EHF CCU 400 mounted to substrate 410, according to an embodiment. CCU 440 may include transducer 402 that is designed to transmit contactless EHF signals in the direction of signal path 420. Path 420 projects in a direction perpendicular to surface 411 of substrate 410. In other words, path 420 projects in the Y-axis direction. The direction of signal path 420 is merely illustrative. For example, the signal path can be directed any suitable direction. For example, FIG. 5 shows a grossly simplified and illustrative EHF CCU 500 mounted to substrate 510. CCU 500 may include transducer 502 that is designed to transmit contactless EHF signals in the direction of signal path 520. Path 520 projects in a direction co-planar to surface 511 of substrate 510. In other words, path 520 projects in the X-axis direction.

Thus, although it may be desirable for EHF signals to be transmitted along a desired signal path (e.g., such a path 420 or 520), non-directed, free flowing EHF signal energy may emit in all directions, thereby resulting in radiation patterns that are not confined to the desired signal path. Non-directed transmission of EHF signals in undesired directions may cause cross-talk. Such cross-talk may exist over-the-air and/or within circuit boards. In addition, non-directed transmission of EHF signals may also result in reduced signal strength, thereby potentially making it more difficult for receiving CCUs to capture the EHF signals. Various embodiments discussed herein are used to direct EHF signals along desired signal pathways. Some embodiments may use beam shaping structures such as those described below in connection with FIGS. 6-16. Other embodiments may use signal blocking structures such as those described below in connection with FIG. 17-20. Yet other embodiments may use a combination of the signal directing and signal blocking structures.

Beam shaping structures may be operative to shape radiation patterns so that EHF signals are directed along a desired path. Such signal shaping may be accomplished using structures or a combination of structures that guide EHF signals along the desired path and block EHF signal from traveling along undesired paths. The structures may exhibit specific shapes to direct signals to and/or from a transducer. The structures may be constructed from a variety of different materials to shape signals. The structures may exist as superstrates that sit on top of one or more CCU and that contain guiding elements that shape EHF signals. Yet other structures may provide selective signal transmission through a predominately signal-impenetrable member.

FIG. 6A shows a perspective view of a spherical signal shaping assembly 600, according to an embodiment. Assembly 600 can include substrate 601, EHF CCU 610, spherical signal directing structure 620, and conductive plates 624 and 626. Substrate 601 can be, for example, a printed circuit board. CCU 610 can be mounted to substrate 601 and can include transducer 611. Conductive plate 624 can sit on top of structure 620 and conductive plate 626 may be positioned on the bottom of structure 620. Structure 620 may envelop a portion of substrate 601 and CCU 610, yet provide a cavity 621 in which at least transducer 611 is exposed and suspended therein. In some embodiments, the shape or curve of structure 620 may have a beam focal point or plane. The beam focal point or plane may represent the location within cavity 621 that may best focus an EHF radiation pattern along a desired path. Transducer 611 may be positioned at or near the focal point so that it may transmit or receive EHF signals along the desired path. FIG. 6B, for example, shows an illustrative radiation pattern 630 emanating from transducer 611. Radiation pattern 630 may exhibit a far field beam pattern having an elliptical cross-section.

The interior surface of structure 620 may be constructed from or lined with a material that directs the EHF radiation emanating from transducer 611 to be directed along the Z-axis. In one embodiment, the interior surface can include metal, which may block EHF radiation from being transmitted through the structure 620. The metal liner or metal material composition of structure 620, coupled with conductive plates 624 and 626, may form a barrier that is relatively EHF signal impenetrable.

Referring back to FIG. 6A, open space may exist on both sides of transducer 611 within cavity 621. This is merely illustrative. If desired, the open space may be filled with a dielectric material. The shape of cavity 621 is shown to be spherical in shape with a fixed radius. It should be appreciated that the shape need not be perfectly spherical. In fact, it can take many different suitable shapes such as an elliptical shape or any other shape that satisfies design criteria. Conductive plates 624 and 626 may take any suitable shape. For example, plates 624 and 626 need not be flat and can be shaped to accommodate various signal path directing criteria and/or industrial design criteria. As a specific example, plates 624 and 626 can each have spherical portions that match the dimensions of structure 620, the combination of which may provide a half-sphere shape. Moreover, plates 624 and 626 can be constructed from one or more dielectric materials that have relatively high dielectric constants. A dielectric material having a relatively high dielectric constant may inhibit EHF signal radiation, but not as much as a conductive material.

The location of the beam focal point or plane may be based on the geometry and material construction of structure 620, and the geometry and material construction of plates 624 and 626. For example, in assembly 600, the focal region may exist in the center of the cavity. The focal region may represent the location where energy of the beam is concentrated. Thus, placing a transducer in or near the focal region may enhance the transducer's ability to transmit and/or receive EHF signal energy. The focal region may allow for transducer placement "slop" as it does not have to be placed at the exact location of a focal plane or focal point. Thus, even if the transducer is positioned slightly adjacent to the focal point, it is sufficiently within the focal region to benefit from beam shaping.

Figure 7A:
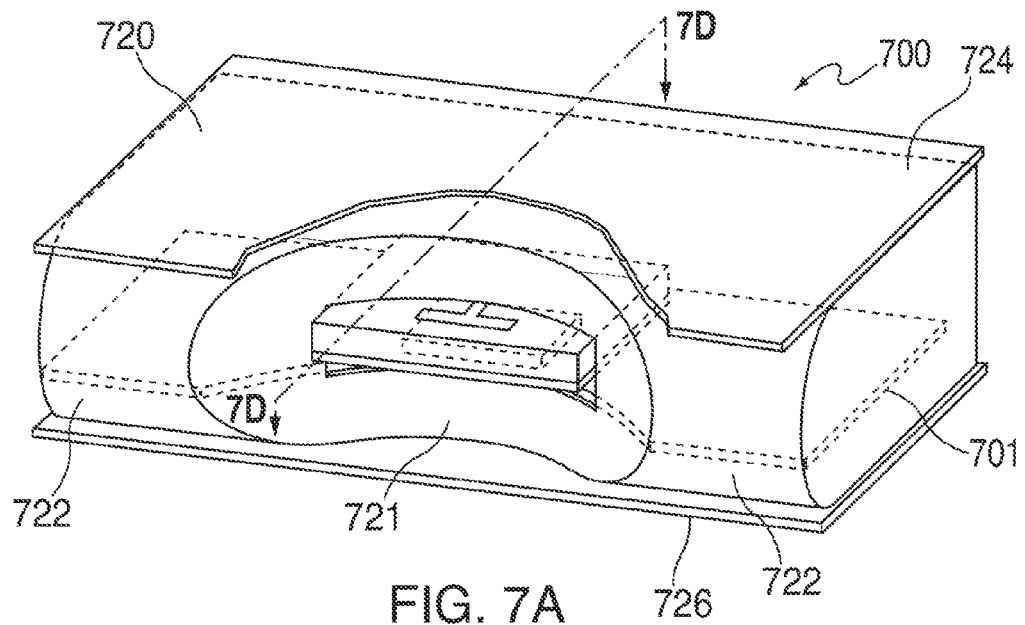
Figure 7B:
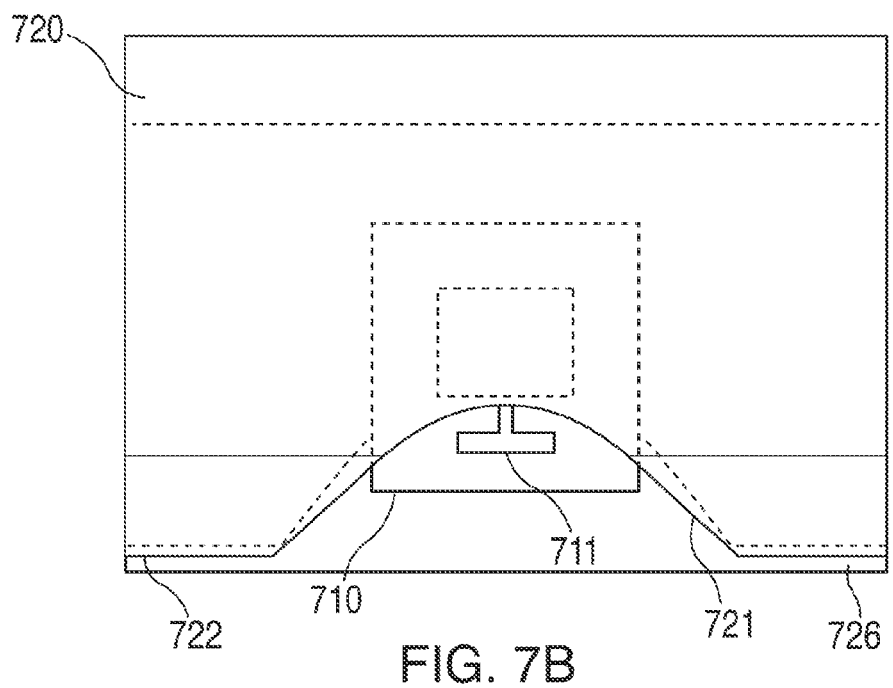
Figure 7C:
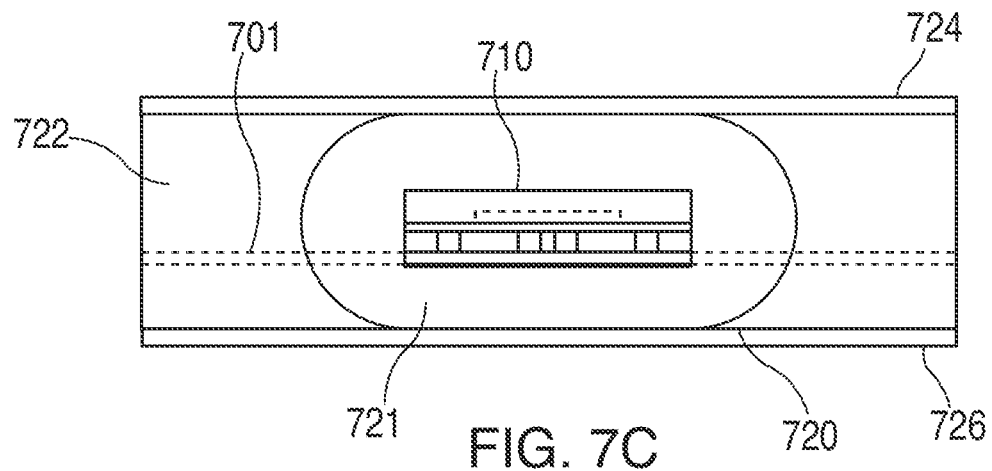
Figure 7D:
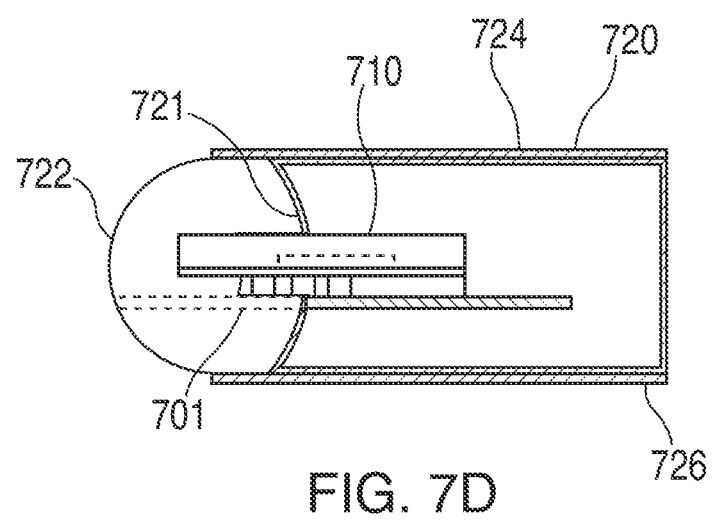
Figure 8A:
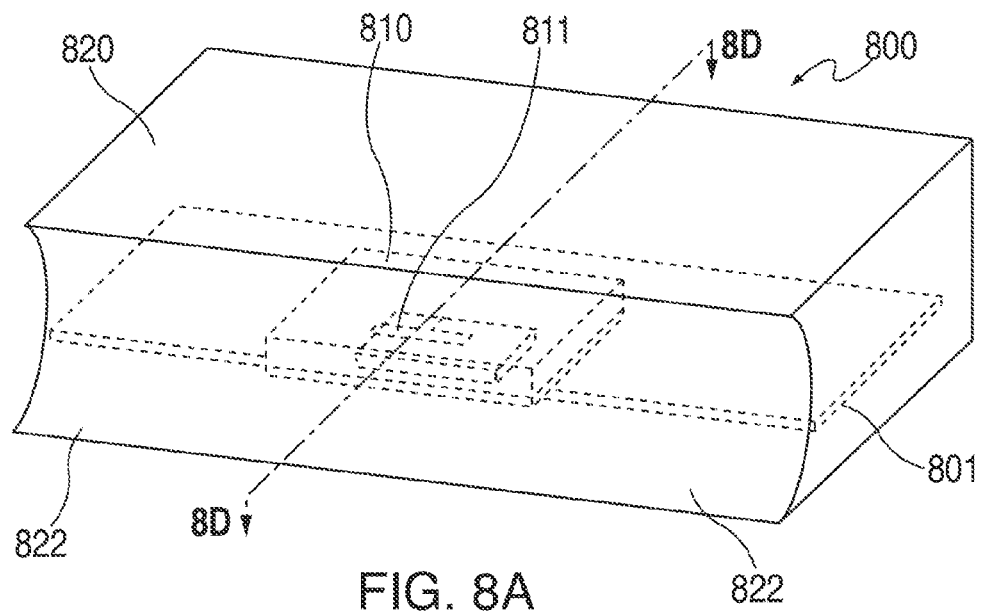
Figure 8B:
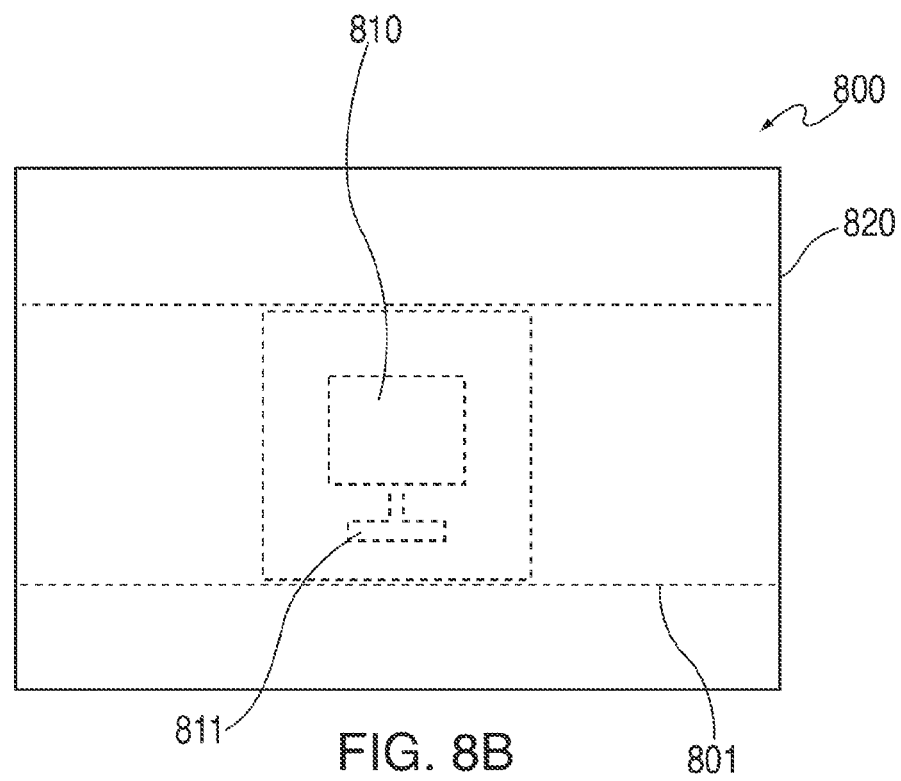
Figure 8C:
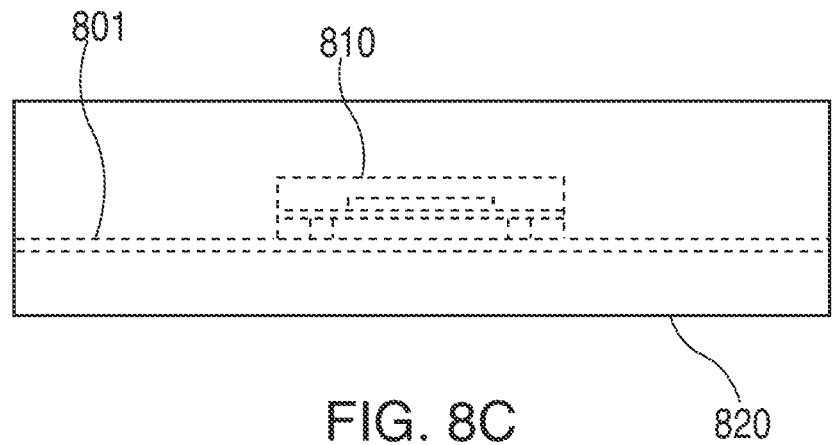
Figure 8D:
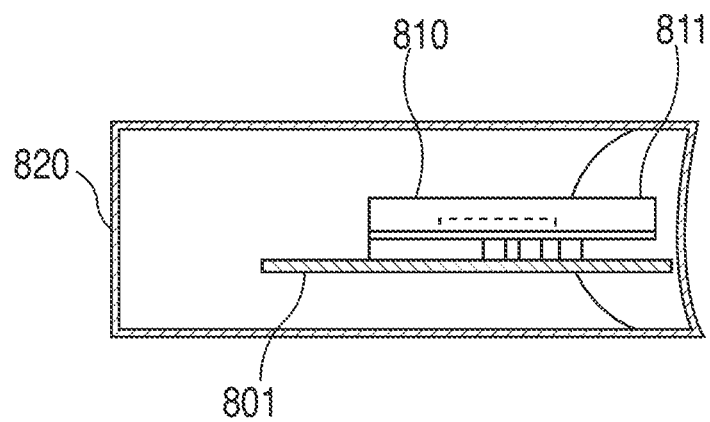

FIGS. 7A-7D show different views of beam shaping assembly 700 according to various embodiments. FIG. 7A shows an illustrative perspective view of assembly 700 that can include substrate 701, EHF CCU 710, and beam shaping structure 720. FIGS. 7B-7D show illustrative top, front, and side views, respectively. Assembly 700 may exhibit similar attributes of assembly 600 (of FIG. 6), but structure 720 may be different. Structure 720 may include dish portion 721, mating portions 722, and beam shaping plates 724 and 726. Beam shaping plate 724 is not shown in FIG. 7B to avoid cluttering the figure. Beam shaping plates 724 and 726 may be similar to conductive plates 624 and 626 of FIG. 6A. Beam shaping plates 724 and 726 may reside on both sides of structure 720, as shown. Beam shaping plates 724 and 726 may be dimensioned so that they overlap a cavity formed by dish portion 721. As shown in FIGS. 7A, 7B, and 7D, plates 724 and 726 extend away from mating portions 722 so that the top and bottom portions of the cavity formed by dish portion 721 are "capped" with the plates. As discussed above, these plates help shape the beam carrying the EHF signals. Plates 724 and 726 can take any suitable shape. For example, instead of a flat planar shape, they may exhibit a curved structure that matches or extends the curved shaped of dish portion 721.

Structure 720 may have a focal point or plane (not shown) based on the geometry and material composition of dish portion 721 and beam shaping plates 724 and 726. Transducer 711 may be placed at or near that focal point. As illustrated, transducer 711 may be suspended away from the surface of dish portion 721. In this approach, a slit or opening may exist in dish portion 721 to enable a portion of CCU 710 (such as the transducer 711) to protrude through dish portion 721 and reside in the focal region. Alternatively, transducer 711 may be contained behind the surface of dish portion 721.

Mating portions 722 may be designed to interface with a counterpart assembly (shown, for example, in FIG. 8). Mating portions 722 may have any suitable shape and be constructed from any number of materials. For example, mating portions 722 may be able to pivot with respect to their counterpart mating portions (not shown). As a specific example, portions 722 may have a convex shape. As another example, mating portions 722 may include magnets for magnetically connecting to their counterpart mating portions.

Structure 720 can be constructed from a material that prevents transmission of EHF signals. For example, the entirety of structure 720, including portions 721 and 722, can be constructed from a conductive material such as metal.

It should be understood that the shape and configuration of structure 720 may vary. For example, mating portion 722 as shown is illustrative. For example, in another embodiment, dish portion 721 may be omitted and mating portion 722 can extend across the entire width of structure 720. In this embodiment, the convex shape of mating portion 722 may extend across the entirety of structure 720.

FIGS. 8A-8D show different views of assembly 800 according to various embodiments. In particular, FIGS. 8A-8D show illustrative perspective, top, front, and side views, respectively. Assembly 800 can include substrate 801, EHF CCU 810, and beam directing structure 820. Beam directing structure 820 can include mating portion 822 and beam directing members (not shown). Transducer 811 may be positioned within structure 820 and adjacent to the mating portion 822 to promote transmission of EHF signals therefrom or the reception thereof. In one embodiment, a dielectric material may exist within the inner confines of structure 820. In another embodiment, structure 820 may constructed from a dielectric material. Beam directing members (not shown) may be similar to beam directing members 724 and 726 of FIGS. 7A-7D, and as such may exhibit similar qualities and functionality that need not be repeated. For example, in one embodiment, the shape of the beam directing structures can extend beyond mating portions 822 and directing structure 821.

Mating portions 822 may be designed to interface with a counterpart assembly (shown, for example, in FIG. 7). Mating portions 822 may have any suitable shape and be constructed from any number of materials. For example, mating portions 822 may be able to pivot with respect to their counterpart mating portions (not shown). As a specific example, portions 822 may have a concave shape. As another example, mating portions 822 may include magnets for magnetically connecting to their counterpart mating portions.

It should be understood that the shape and configuration of structure 820 may vary. For example, in another embodiment, a dish portion (not shown) may exist within structure 820 and concave mating portions may exist on both side of that dish portion. In this embodiment, the concave mating portion 822 may be interrupted with a cavity or dish portion. Moreover, the transducer may reside in the focal region of the dish portion of this embodiment.

FIG. 9 shows assemblies 700 and 800 interfacing with each other via their respective mating portions. When mated, mating portions 722 and 822 may interface with each other. That is, the concave mating shape of assembly 800 may engage and pivot about the convex mating shape of assembly 700.

FIGS. 10A-10C show different views of a two device system that contactlessly communicates using EHF CCUs. In particular, FIG. 10A shows a perspective view, FIG. 10B shows a side view, and FIG. 10C shows a top view. Device 1010 can include EHF CCUs 1020 and 1022 and beam directing structure 1030 according to an embodiment. Device 1050 can include EHF CCU 1060 and 1062 and beam directing structure 1070 according to an embodiment. CCUs 1020 and 1060 may be operative to communicate with each other (and may be referred to as a first coupled pair) and CCUs 1022 and 1062 may be operative to communicate with each other (and may be referred to as a second coupled pair). Beam directing structures 1030 and 1070 may be operative to prevent crosstalk among the coupled pairs and between adjacent CCUs on any given device (e.g., prevent crosstalk between CCU 1020 and 1022).

Each of beam directing structures 1030 and 1070 may be constructed from a conductive material. This conductive material can block or prevent EHF signals from passing from one side to the other. Structures 1030 and 1070 may each incorporate collimating portions 1040, 1042, 1080, and 1082 that permit signals to pass through. In one embodiment, collimating portions may be slot antennas or holes that exist within structures 1030 and 1070. If desired, the slot antenna or holes may be filled with a dielectric material such as plastic, or air may occupy the space. Use of a dielectric material within the collimating portions may further collimate the EHF signals and direct them along a desired path.

The spacing of CCUs relative to the beam structures (shown as $d_3$), the width of the structures themselves (shown as $d_2$), and the spacing between adjacent structures (shown as $d_1$) may all be factors that can be adjusted to obtain the desired signal pathways for both coupled pairs of CCUs, while simultaneously minimizing crosstalk. In addition, the spacing of one or more of $d_{1-3}$ may also be based on the wavelength of the EHF signals being used in the system, the material composition of structures 1030 and 1070, and the material composition of portions 1040, 1042, 1080, and 1082, and any material (not shown) that may be exist between structures 1030 and 1070. For example, the separation between plates 1030 and 1070 may be less than ½ wavelength of the signals traversing the gap (d1). The distance $d_3$ may be set to mitigate cross-talk among adjacent CCUs on the same side of a structure. The distances $d_1$ and $d_2$ may be set to minimize crosstalk among coupled pairs. In addition, the spacing may be set to suppress EHF transmission leakage in a specific direction. For example, the spacing of structures 1030 and 1070 may be set to prevent leakage in the directions orthogonal to the direction existing between gap (d1). That is, if the direction of the gap is considered the Z-direction, leakage may be limited in one or both of the X and Y directions.

The size, shape, orientation, and material composition of portions 1040, 1042, 1080, and 1082 may be selected to achieve the desired signal shaping. For example, each of the portions may be positioned at any suitable angle, and not just at the 90 degree angle as shown. Zero degree, forty-five degree, and any other suitable angle may be used. In some embodiments, portions existing within the same structure (e.g., 1080 and 1082) may be set at different angles, and their counterpart portions (e.g., 1040 and 1042) may be set at the same or different angles. For example, assume portion 1080 is set to 0 degrees and 1082 is set to 45 degrees. Their respective counterpart portions, portions 1040 and 1042, respectively, may be also be set to 0 and 45 degrees. As another example, assume portions 1080 and 1082 are set to 45 degrees. Their respective counterpart portions, portions 1040 and 1042, respectively, may be also be set to 45 degrees, or alternatively, portions 1040 and 1042 can be each be set to angles different than 45 degrees.

The size of the portions, such as width and length, may be determined by the wavelength of the signals. For example, the width may be less than one half of the contactless signal wavelength and the length may be greater than one half of the contactless signal wavelength. In this example, the thickness (d2) of the portion may be set independent of signal wavelength.

FIG. 11 shows an illustrative EHF signal propagation diagram radiating in the system of FIG. 10. In particular, FIG. 11 shows CCU unit 1060 operating as a transmitter EHF CCU and CCU unit 1020 operating as a receiver EHF CCU. CCU unit 1060 may be oriented to transmit EHF signals along path 1120, which is co-planer to top surface 1061 of unit 1060. Path 1120 flows from unit 1060 through collimating portions 1080 and 1040 of structures 1070 and 1030, respectively and ends at unit 1020. EHF unit 1060 transmits EHF signal, which are shown as radiation signals 1110. Signals are transmitted in the direction of structure 1070. Signals are shown passing through collimating portion 1080, but are blocked by structure 1070. The signals pass through the air gap between structures 1030 and 1070 and pass through collimating portion 1040 and are captured by unit 1020.

FIGS. 12A-12C show different views of mezzanine beam forming structures according to an embodiment. In particular, FIG. 12A shows a perspective view, FIG. 12B shows a top view, and FIG. 12C shows a front view. Mezzanine structures may be constructed to have multiple components that are placed in strategic locations around an EHF CCU to direct EHF signals along a desired pathway. The components may exhibit different shapes and/or material properties to direct signals along the desired pathway. For example, a combination of materials having relatively high dielectric properties and relatively low dielectric properties may be used. The relatively high dielectric property materials may be used to inhibit EHF siunal radiation and may be placed in locations where signal propagation is not desired. The relatively low dielectric property materials may be used to facilitate EHF signal radiation and may be placed in locations where signal propagation is desired. Additional materials that have EHF signal reflecting properties may be strategically placed to further enhance or guide EHF signals along a desired path.

FIGS. 12A-12C show assembly 1200 that includes EHF CCUs 1210, 1230, and 1250 all mounted to substrate 1201. EHF CCUs 1210, 1230, and 1250 may each be operative to transmit and/or receive EHF signals in a direction perpendicular with respect to a top surface of substrate 1201. In other words, CCUs 1210, 1230, and 1250 may be configured for vertical signal paths shown as paths 1202, 1203, and 1204. Although the CCUs may share common directionality in signal paths, each of the CCUs may be oriented differently with respect to each other. For example, CCU 1210 may be oriented such that its signal path coincides with the left most portion of assembly 1200, CCU 1230 may be orientated such that its signal path coincides with a middle front side of assembly 1200, and CCU 1250 may be oriented so that its signal path coincides with the right most portion of assembly 1200.

Beam directing structures may further assist each CCU in directing contactless signals along desired signal paths. These structures can be multi-sided structures that surround multiple sides of each CCU. The structure may include multiple components that are made with different materials to shape the signal path direction of the contactless signals. Alternatively, the structure may be a single integrated component that exhibits different material properties to shape the signal path direction of the contactless signals. Thus, regardless of how structure is made, it can be designed to guide signals along a desired signal path. For example, in one embodiment, the structures may be a five-sided structure that surrounds five sides of a CCU. In such an example, the structure may surround the bottom surface, and the four vertical walls of a CCU, but leave the top surface exposed. The structure can be designed such the signal path flows to/from any one of the vertical walls.

A more detailed example of a multi-walled beam directing structure is now discussed. Each of the CCUs may be partially surrounded by structures, labeled 1220, 1221 1222, 1240, 1241, 1242, 1260, 1261, 1262, and 1270, and substrate 1201. These structures and the substrate may collectively work together to direct contactless signal along signal paths 1202-1204. As illustrated, structures 1220, 1240, and 1260 may have a "C" shape construction that implies that three sides of each CCU are surrounded. This is illustrated in the FIGS, but it is understood that that is merely illustrative and that any suitably shaped structure may be used to at least partially surround the CCU. The open side may abut one or both of relatively low dielectric structures (labeled as 1222, 1242, and 1262) and relatively high dielectric structures (labeled as 1270). The relatively high dielectric structures may also be placed in between adjacent c shaped structures. For example, relatively high dielectric structures 1270 may be placed between structures 1220 and 1240 and between structures 1240 and 1260. Structures 1220, 1240, and 1260 may each be constructed from a non-conductive material having a dielectric constant that exists between the dielectric constants of the relatively low and relatively high structures. The structures (e.g., structures 1220, 1222, and 1270) may also provide structural support.

Reflective structures 1221, 1241, and 1261 (shown in FIG. 12A) may be placed adjacent to low dielectric structures 1220, 1240, and 1260, respectively, as shown. Reflective structures 1221, 1241, and 1261 may further guide EHF signals along their respective paths 1202-1204. Reflective structures 1221, 1241, and 1261 may be constructed from a material that reflects EHF signal energy. Reflective structures may be strategically placed in other locations within assembly 1200. For example, reflective structures may be placed on an inside surface of structures 1220, 1240, and 1260 to reflect any EHF signal energy towards the relatively low dielectric structure.

The combination of the different structures, their arrangement and their associated differences in dielectric properties, all work together to direct EHF signals along the desired pathways. For example, FIG. 13 shows an illustrative screen shot of EHF signals being transmitted from CCU unit 1210 in the direction of CCU unit 1210' along path 1202. As shown, a majority of EHF signal energy 1310 is directed up towards CCU unit 1210'

FIGS. 14A and 14B show illustrative perspective and front views, respectively, of assembly 1400 according to an embodiment. Assembly 1400 includes the mezzanine guiding structure of FIG. 12 and superstrate signal guiding structure 1410. Superstrate signal guiding structure 1410 may sit on top mezzanine structure 1200, for example. Superstrate 1410 may include dielectric substrate 1420 and tuned structures 1430, 1440, and 1450. Tuned structures 1430, 1440, and 1450 may each include several members that are vertically stacked on top of each other and embedded within dielectric substrate 1420. For example, tuned structure 1430 may include members 1431-1434 that are arranged in a vertical stack that is perpendicular to a top surface of substrate 1420. Members 1431-1434 may be spaced apart at fixed distances to assist in guiding EHF signals traveling along a desired path. Members 1431-1434 may be constructed from a conductive material such as metal, which is effective in blocking EHF signal radiation.

Structures 1430, 1440, and 1450 may be positioned above their respective CCUs, or more particularly, above their respective transducers. For example, structure 1430 is shown positioned above CCU 1210 and above and adjacent to relatively low dielectric structure 1220 such that path 1401 is not obstructed. In this configuration, tuned structure 1430 may further assist in guiding EHF signals along respective path 1401. The same holds true for tuned structures 1440 and 1450 and their respective paths 1402 and 1403.

FIGS. 15A-15C show illustrative perspective, top, and front views, respectively, of superstrate beam directing structure 1500 according to an embodiment. Structure 1500 can include dielectric substrate 1520 and tuned structures 1530, 1540, and 1550. Structure 1500 may reside on top of mezzanine structure (not shown). Tuned structures 1530, 1540, and 1550 may each include several members that are horizontally arranged next each other and embedded within dielectric substrate 1520. For example, tuned structure 1530 may include members 1531-1534 that are arranged in a plane that is parallel to a top surface of substrate 1520. Members 1531-1534 may be spaced apart at fixed distances to guide EHF signals traveling along a desired path. Members 1531-1534 may be constructed from a conductive material such as metal, which is effective in blocking EHF signal radiation. The horizontal arrangement of tuned structures 1530, 1540, and 1550 may be suited for use when the signal paths are side oriented such those shown by paths 1501-1503.

It is understood that superstrate signal directing structures can be used as discrete components that interact with a particular CCU, in contrast to the multiple component structures of FIGS. 14 and 15. For example, individual structures such as those shown in FIGS. 16A and 16B may be used according to various embodiments. FIG. 16A shows superstrate structure 1610 with horizontally oriented tuned structures. FIG. 16B shows superstrate structure 1620 with vertically oriented tuned structures.

Crosstalk can be mitigated using signal blocking structures according to various embodiments and particularly to embodiments that block signal propagation through circuit boards. Such signal blocking structures may also be capable of absorbing and/or blocking EHF signal energy that has entered the circuit boards (depending on the material used). Preventing signal propagation through the circuit boards can advantageously result in reduced cross-talk and increased signal strength.

FIGS. 17A and 17B show an illustrative side and perspective views of an assembly having a signal blocking structure incorporated within the circuit board. Assembly 1700 can include substrate 1701, signal blocking structure 1710 embedded within substrate 1701, and CCU 1720 that is mounted on top of substrate 1701. Signal blocking structure 1710 can include members 1711-1713. Members 1711-1713 may be dimensioned and spaced apart at a fixed distance between adjacent members based on the signaling characteristics of EHF signals being transmitted or received by CCU 1720. For example, in an embodiment where members 1711-1713 are conductive plates, the spacing between members may be less than one fourth of the wavelength of the EHF signal frequency of interest, and adjusted for dielectric properties of substrate 1701. In addition, the orientation of the planar surfaces of the members 1711-1713 is parallel to the electric field polarization. Furthermore, the dimension of members 1711-1713 should be at least half or one fourth of a wavelength or the width of the substrate, the depth can be approximately one quarter the wavelength, and the thickness should be greater than 4 skin depths. In other embodiments, members 1711-1713 can include conductive plates, reflecting plates, EHF absorbing plates, and any combination thereof.

FIG. 18A shows an illustrative screen shot of EHF signal radiation being transmitted from CCU 1720 to CCU 1830. As shown, EHF signal radiation 1810 does not propagate through substrate 1701. FIG. 18B shows another illustrative screen shot of EHF signal radiation being transmitted from CCU 1830 and received by CCU 1720. As shown, EHF signal radiation 1820 does not propagate through substrate 1701.

FIGS. 19A and 19B show an illustrative side and perspective views of an assembly having a signal blocking structure incorporated within the circuit board. Assembly 1900 can include substrate 1901, signal blocking structure 1910 embedded within substrate 1901, and CCU 1920 that is mounted on top of substrate 1901. Signal blocking structure 1910 can be constructed as single metal block 1911 that is secured to conductive plate 1912, as shown. Alternatively, the single metal block can be replaced with a series of metal vias that stem from the conductive plate to form a metal fence.

FIG. 20 shows an illustrative screen shot of EHF signal radiation being transmitted from CCU 1920. As shown, signal blocking structure 1910 is effective in preventing any EHF signal radiation 2010 from propagating through substrate 1901.

In some approaches, the housings that contain EHF CCUs may themselves be used to direct EHF signals and limit propagation thereof. FIG. 21 illustrates such an embodiment. In particular, FIG. 21 shows assembly 2100 that includes housing 2110 and housing 2150. Housing 2110 may include substrate 2120, ground plane 2121, which is part of substrate 2120, and CCU 2130. Housing 2150 may include substrate 2160, ground plane 2161, which is part of substrate 2160, and CCU 2170. Housings 2110 and 2150 may both be constructed from metal or other material that prevents EHF signals from passing there through. Openings 2112 and 2152 exist in housings 2110 and 2150, respectively, to enable a signal path between CCUs 2130 and 2170. The spacing distance between housings 2110 and 2150 may be chosen to limit signal leakage through the interface existing between the two housings. It is understood that openings 2112 and 2152 represent a pathway through which EHF signals can pass. In some embodiments, the openings can be physical openings occupied by air, or openings can be filled with a dielectric material. If desired, signal blocking structures of FIGS. 17 and 19 can be incorporated into one or both substrates 2120 and 2160.

EHF signal propagation may be limited by controlling the spacing between inner wall 2104 and ground plane 2121. This spacing, shown as D, may be set to be less than one half of the EHF signal wave length. Such spacing may be effective in preventing EHF signal propagation in the direction of α, as shown. This direction, α, may be parallel to the top surface substrate 2120. FIG. 22 shows an illustrative EHF signal radiation screenshot in which CCU 2170 is transmitting EHF signal towards EHF CCU 2130. As shown, EHF signal radiation 2210 exist next to CCUs 2170 and 2130, but is suppressed beyond CCU 2130 in the direction of α.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A contactless communication device comprising:
   a substrate;
   a contactless communication unit (CCU) mounted to the substrate, the CCU comprising a transducer; and
   a beam shaping reflector that partially enshrouds the CCU, wherein the transducer is operative to selectively transmit and receive contactless signals along a signal-shaped path at least partially defined by the beam shaping reflector, wherein the beam shaping reflector limits the contactless signal to a signal-shaped radiation pattern that is less than a non-directed radiation pattern of a contactless signal transmitted or received via untethered free-space.

2. The device of claim 1, wherein the reflector comprises a focal region, and wherein signal energy is concentrated in the focal region.

3. The device of claim 2, wherein the transducer is positioned in the focal region.

4. The device of claim 1, wherein the reflector comprises:
   a concave portion that defines a volume, wherein the transducer is contained in the volume.

5. The device of claim 4, wherein the concave portion comprises a beam focal region, and wherein the transducer is positioned in the beam focal region.

6. The device of claim 1, wherein the beam shaping reflector mitigates cross-talk.

7. The device of claim 1, wherein the beam shaping reflector comprises first and second outer surfaces, the beam shaping reflector further comprising:
   a first conductive plate mounted to the first outer surface; and
   a second conductive plate mounted to the second outer surface, wherein the first and second conductive plates are operative to define the signal-shaped path.

8. The device of claim 1, wherein the beam shaping reflector comprises a curved portion.

9. A beam directing system comprising:
   a first beam directing structure comprising:
      at least a first signal blocking portion operative to block transmission of contactless signals;
      at least a first signal collimating portion positioned within the first signal blocking portion, the signal collimating portion operative to collimate contactless signals that pass through the first beam directing structure; and
   a second beam directing structure comprising:
      at least a second signal blocking portion operative to block transmission of contactless signals; and
      at least a second signal collimating portion positioned within the second signal blocking portion, the signal collimating portion operative to collimate signals that pass through the second beam directing structure,
   wherein the first and second beam directing structure are aligned with respect to each other such that the first and second collimating portions are substantially co-axially aligned.

10. The system of claim 9, further comprising:
    a first contactless communication unit (CCU) positioned adjacent to the first beam directing structure, the first CCU operative to selectively transmit the contactless signals through the first beam directing structure and receive the contactless signals from the first beam directing structure.

11. The system of claim 10, further comprising:
    a second CCU positioned adjacent to the second beam directing structure, the second CCU operative to selectively transmit the contactless signals through the second beam directing structure and receive the contactless signals from the second beam directing structure.

12. The system of claim 9, wherein a fixed distance exists between the first and second beam directing structures, wherein the fixed distance is based on a wavelength of the contactless signals.

13. The system of claim 12, wherein the fixed distance is occupied by a dielectric.

14. The system of claim 13, wherein the dielectric comprises air.

15. The system of claim 9, wherein the first and second signal collimating portions each comprises at least one slot antenna.

16. The system of claim 9, wherein the first and second signal collimating portion each comprise a dielectric material.

17. The system of claim 9, wherein the first and second signal blocking portions each comprises a conductive material.

18. The system of claim 9, further comprising:
    at least a third collimating portion positioned within the signal blocking portion of the first structure;
    a third CCU aligned with respect to the third collimating portion;
    at least a fourth collimating portion positioned within the signal blocking portion of the second structure; and
    a fourth CCU aligned with respect to the fourth collimating portion,
    wherein the third and fourth signal collimating portions are co-axially aligned.

19. A mezzanine beam guide, comprising:
a substrate having a central axis;
a first contactless communication unit (CCU) mounted to the substrate at a first location along the central axis, the first CCU comprising a first transducer oriented in a first direction;
a second CCU mounted to the substrate at a second location along the central axis, the second CCU comprising a second transducer oriented in a second direction;
at least a first beam directing structure characterized as a first type mounted on the substrate adjacent to the first transducer;
at least a second beam directing structure characterized as the first type mounted on the substrate adjacent to the second transducer;
at least a third beam directing structure characterized as a second type mounted to the substrate adjacent to the first CCU;
at least a fourth beam directing structure characterized as the second type mounted to the substrate adjacent to the second CCU; and
at least a first beam dissipating structure mounted on the substrate between the first and second CCUs,
wherein the first, second, third, and fourth beam directing structures, and the first beam dissipating structure collectively shape signal paths of contactless signals for the first and second CCUs.

20. The mezzanine structure of claim 19, wherein the first beam dissipating structure is positioned based on at least one desired signal path of contactless signals.

21. The mezzanine structure of claim 19, further comprising:
a third CCU mounted to the substrate at a third location along the central axis, the third CCU comprising a third transducer oriented in a third direction;
at least a second beam dissipating structure mounted on the substrate between the second and third CCUs;
at least a fifth beam directing structure characterized as the first type mounted on the substrate adjacent to the third transducer; and
at least a sixth beam dissipating structure characterized the second type mounted on the substrate.

22. The mezzanine structure of claim 19, wherein the first and second beam directing structures each comprise a dielectric material having a first dielectric constant.

23. The mezzanine structure of claim 22, wherein the third and fourth beam directing structures each comprise a dielectric material having a second dielectric constant, wherein the second dielectric constant is less than the first dielectric constant.

24. The mezzanine structure of claim 19, wherein the third and fourth beam directing structures each operative to direct contactless signals in a direction orthogonal to the central axis.

25. The mezzanine structure of claim 19, wherein the third and fourth beam directing structures each comprises contactless signal reflecting material.

26. A mezzanine beam guide, comprising:
a substrate;
a plurality of contactless communication units (CCUs) mounted to the substrate; and
a mezzanine beam guide operative to guide contactless signals in a direction perpendicular to a CCU mounting surface of the substrate, wherein the mezzanine beam guide limits the contactless signal transmitted or received by each CCU to a signal-shaped radiation pattern that is less than a non-directed radiation pattern of a contactless signal transmitted or received via untethered free-space to mitigate lateral and multi-path crosstalk among the plurality of CCUs.

27. The mezzanine beam guide of claim 26, further comprising a beam-forming directing structure mounted on top of the mezzanine beam guide.

28. The mezzanine beam guide of claim 26, wherein the beam-forming directing structure comprises a superstrate and a plurality of wave-guiding tuned metal structures.

29. The mezzanine beam guide of claim 28, wherein a first subset of the plurality of wave-guiding tuned metal structures are vertically stacked above one of the CCUs.

30. The mezzanine beam guide of claim of 29, wherein the first subset of the plurality of wave-guiding tuned metal structures comprises at least two wave-guiding tuned metal structures that are arranged in a stack, wherein a fixed distance exist between immediately adjacent metal structures.

31. The mezzanine beam guide of claim 29, wherein the first subset is positioned above a transducer of the CCU.

32. The mezzanine beam guide of claim 28, wherein each of the CCUs is associated with respective subsets of the plurality of wave-guiding tuned metal structures.

33. The mezzanine beam guide of claim 32, wherein each subset comprises at least two wave-guiding tuned metal structures arranged in a vertical stack that rises above its respective CCU.

34. The mezzanine beam guide of claim 32, wherein each subset comprises at least two wave-guiding tuned metal structures arranged in a horizontal stack that spreads across a plane that is co-planar with its respective CCU.

35. A superstrate beam guiding structure for use in conjunction with a contactless communications unit (CCU), the structure comprising:
a plurality of wave-guiding tuned metal structures that are embedded in a dielectric material that is dimensioned to be mounted to a substrate containing the CCU,
wherein the wave-guiding tuned metal structures assist in defining a signal path for contactless signal wave propagation, wherein the plurality of wave-guiding tuned metal structures limits the contactless signal transmitted or received by the CCU to a signal-shaped radiation pattern that is less than a non-directed radiation pattern of a contactless signal transmitted or received via untethered free-space.

36. The superstrate of claim 35, wherein the signal path is arranged in a vertical direction that is perpendicular to a plane of the superstrate.

37. The superstrate of claim 35, wherein the signal path is arranged in a horizontal direction that is coplanar with a plane of the superstrate.

38. The superstrate of claim 35, wherein the signal path is arranged in horizontal and vertical directions.

39. The superstrate of claim 35, wherein each of the wave-guiding tuned metal structures are dimensioned and spaced apart from each other based on the dielectric material and a frequency and a wavelength of a contactless signal.

40. The superstrate of claim 35, wherein the dielectric material occupies space existing between each of the wave-guiding tuned metal structures.

41. An apparatus comprising: a circuit board including a first surface and second surface, wherein a distance between the first and second surfaces defines a thickness, wherein the circuit board comprises: a first contactless communications unit (CCU) mounting region existing on the first surface; a first signal blocking structure positioned beneath the first CCU mounting region within the thickness; a second CCU mounting region existing on the first surface; a second signal blocking structure positioned beneath the second CCU mounting region within the thickness; and wherein the first and second signal blocking structures are operative to inhibit transmission of contactless signals through the circuit board; and wherein the first signal blocking structure comprises a conductive plate and a plurality of conductive vias extending from the conductive plate to form a conductive fence.

42. The apparatus of claim 41, wherein the first signal blocking structure comprises a plurality of conductive plates.

43. The apparatus of claim 41, wherein the first signal blocking structure is constructed from a material having a dielectric constant that is less than a dielectric constant of the circuit board.

44. The apparatus of claim 41, wherein the first signal blocking structure comprises at least one conductive plate and a conductive block secured to the conductive plate.

45. A system comprising: a first conductive housing comprising a first inner surface and a second inner surface; a circuit board secured to the first inner surface, the circuit board comprising a ground layer; and a first contactless communications unit (CCU) mounted on the circuit board, wherein contactless signals are transmitted by the CCU and are intended for a target CCU, wherein a distance between the ground layer and the second inner surface is defined to minimize contactless signal propagation beyond the target CCU; and a second conductive housing comprising the target CCU, wherein the first and second conductive housings are spaced a fixed distance apart to mitigate contactless signal leakage.

* * * * *

UNITED STATES PATENT AND TRADEMARK OFFICE
CERTIFICATE OF CORRECTION

| | | |
|---|---|---|
| PATENT NO. | : 9,490,874 B2 | Page 1 of 1 |
| APPLICATION NO. | : 14/518815 | |
| DATED | : November 8, 2016 | |
| INVENTOR(S) | : McCormack et al. | |

It is certified that error appears in the above-identified patent and that said Letters Patent is hereby corrected as shown below:

In the Specification

In Column 3, Line 22, delete "ERE" and insert -- EHF --, therefor.

In Column 3, Line 67, delete "ERE" and insert -- EHF --, therefor.

In Column 11, Line 42, delete "siunal" and insert -- signal --, therefor.

In the Claims

In Column 18, Line 8, Claim 28, delete "claim 26" and insert -- claim 27 --, therefor.

Signed and Sealed this
Fifth Day of May, 2020

Andrei Iancu
*Director of the United States Patent and Trademark Office*